(12) United States Patent
Jeske et al.

(10) Patent No.: US 10,082,545 B2
(45) Date of Patent: Sep. 25, 2018

(54) LASER-BASED SENSOR FOR MEASURING AN EXTERNAL MAGNETIC FIELD

(71) Applicant: RMIT University, Melbourne (AU)

(72) Inventors: Jan Jeske, Fitzroy North (AU); Andrew Greentree, Fawkner (AU); Jared Cole, North Coburg (AU)

(73) Assignee: RMIT University, Melbourne (AU)

( * ) Notice: Subject to any disclaimer, the term of this patent is extended or adjusted under 35 U.S.C. 154(b) by 12 days.

(21) Appl. No.: 14/879,769

(22) Filed: Oct. 9, 2015

(65) Prior Publication Data
US 2017/0030982 A1 Feb. 2, 2017

(30) Foreign Application Priority Data
Jul. 28, 2015 (AU) ................. 2015902991

(51) Int. Cl.
*G01R 33/032* (2006.01)

(52) U.S. Cl.
CPC .................. *G01R 33/032* (2013.01)

(58) Field of Classification Search
CPC ................................................ G01R 33/032
USPC ........................................................ 324/244.1
See application file for complete search history.

(56) References Cited

U.S. PATENT DOCUMENTS

| | | | | |
|---|---|---|---|---|
| 5,781,513 A * | 7/1998 | Fuji | ............... | G11B 11/10521 369/100 |
| 8,896,302 B1 * | 11/2014 | Zhu | ............... | G01R 33/032 324/244.1 |
| 2005/0201715 A1 * | 9/2005 | Ellwood, Jr. | ........ | G02B 6/2746 385/147 |
| 2007/0014392 A1 * | 1/2007 | Madey | ............... | H05G 2/00 378/119 |
| 2009/0185586 A1 * | 7/2009 | Jhung | ............... | G02B 5/32 372/20 |
| 2010/0315079 A1 * | 12/2010 | Lukin | ............... | G01R 33/032 324/244.1 |
| 2014/0061510 A1 * | 3/2014 | Twitchen | ............... | C30B 29/04 250/492.1 |
| 2014/0072008 A1 | 3/2014 | Faraon et al. | | |

(Continued)

OTHER PUBLICATIONS

Jeske, et al., Laser threshold magnetometry, New J. Phys. 18, 013015, Oct. 23, 2014, 14 pp.

(Continued)

*Primary Examiner* — Jay Patidar
(74) *Attorney, Agent, or Firm* — Shumaker & Sieffert, P.A.

(57) ABSTRACT

In general, techniques of this disclosure are directed to a sensor for measuring an external magnetic field. The sensor an optical cavity, a laser medium which together with the optical cavity has a laser threshold, a laser pump, and a radio-frequency (RF) drive applied to the laser medium, such that the laser threshold varies with a change in the external magnetic field. The RF drive may be applied to the laser medium at or around a particular resonance frequency which varies depending on the external magnetic field, such that depending on the value of the external magnetic field, the RF drive induces transitions between at least two states of the laser medium, each state causing a different laser threshold in an intensity of a laser output. Further, the intensity of the laser output may provide a measurement of the value of the external magnetic field.

20 Claims, 17 Drawing Sheets

(56) References Cited

U.S. PATENT DOCUMENTS

| | | | |
|---|---|---|---|
| 2014/0320863 A1* | 10/2014 | Christensen | G01C 19/661 356/451 |
| 2014/0354275 A1* | 12/2014 | Sheng | G01R 33/26 324/244.1 |
| 2016/0223621 A1* | 8/2016 | Kaup | G01R 33/032 |
| 2016/0231394 A1* | 8/2016 | Manickam | G01R 33/032 |
| 2016/0266110 A1* | 9/2016 | Ozdemir | G01N 15/1434 |
| 2016/0282427 A1* | 9/2016 | Heidmann | G01R 33/26 |
| 2016/0356863 A1* | 12/2016 | Boesch | G01R 33/032 |

OTHER PUBLICATIONS

Gopalakrishnan Balasubramanian, et al., "Nanoscale imaging magnetometry with diamond spins under ambient conditions", Nature, vol. 455, Oct. 2, 2008 (5 pgs.).

Degen, "Scanning magnetic field microscope with a diamond single-spin sensor", IBM Research Division, Almaden Research Center, Sep. 23, 2008 (4 pgs.).

Marcus W. Doherty et al., "The nitrogen-vacancy colour centre in diamond", Physics reports 528, Feb. 26, 2013, 1-45.

J.M. Taylor et al., "High-sensitivity diamond magnetometer with nanoscale resolution", nature physics, vol. 4, Oct. 2008, 810-816.

\* cited by examiner $$n = -(a + b - \sqrt{c})/d$$

$a = G_{23}G_{56}L_{23}L_{57}L_{71}A_{45}A_{12}^3 - G_{23}G_{56}L_{31}L_{57}L_{71}A_{45}A_{12}^3 + G_{56}L_{23}L_{57}L_{71}\kappa A_{45}A_{12}^3 + G_{56}L_{31}L_{57}L_{71}\kappa A_{45}A_{12}^3$ $\quad + 2G_{23}L_{57}L_{64}L_{71}\kappa A_{45}A_{12}^3 + 2G_{23}G_{56}L_{57}L_{71}A_{45}^2A_{12}^2 - 2G_{23}G_{56}L_{31}L_{57}L_{71}A_{45}^2A_{12}^2 + 2G_{56}L_{23}L_{57}L_{71}\kappa A_{45}^2A_{12}^2$ $\quad + 2G_{56}L_{31}L_{57}L_{71}\kappa A_{45}^2A_{12}^2 + 4G_{23}L_{57}L_{64}L_{71}\kappa A_{45}^2A_{12}^2 + 4G_{23}G_{56}L_{23}L_{54}L_{71}\Omega^2 A_{12}^2 - 4G_{23}G_{56}L_{31}L_{54}L_{71}\Omega^2 A_{12}^2$ $\quad + 4G_{23}G_{56}L_{23}L_{57}L_{71}\Omega^2 A_{12}^2 - 4G_{23}G_{56}L_{31}L_{57}L_{71}\Omega^2 A_{12}^2 + 4G_{23}G_{56}L_{23}L_{64}L_{71}\Omega^2 A_{12}^2 - 4G_{23}G_{56}L_{31}L_{64}L_{71}\Omega^2 A_{12}^2$ $\quad + 4G_{23}G_{56}L_{23}L_{54}L_{74}\Omega^2 A_{12}^2 - 4G_{23}G_{56}L_{31}L_{54}L_{74}\Omega^2 A_{12}^2 + 4G_{23}G_{56}L_{23}L_{57}L_{74}\Omega^2 A_{12}^2 - 4G_{23}G_{56}L_{31}L_{57}L_{74}\Omega^2 A_{12}^2$ $\quad + 4G_{23}G_{56}L_{23}L_{64}L_{74}\Omega^2 A_{12}^2 - 4G_{23}G_{56}L_{31}L_{64}L_{74}\Omega^2 A_{12}^2 + 4G_{56}L_{23}L_{54}L_{71}\kappa\Omega^2 A_{12}^2 + 4G_{56}L_{31}L_{54}L_{71}\kappa\Omega^2 A_{12}^2$ $\quad + 4G_{56}L_{23}L_{57}L_{71}\kappa\Omega^2 A_{12}^2 + 4G_{56}L_{31}L_{57}L_{71}\kappa\Omega^2 A_{12}^2 + 4G_{56}L_{23}L_{64}L_{71}\kappa\Omega^2 A_{12}^2 + 4G_{56}L_{31}L_{64}L_{71}\kappa\Omega^2 A_{12}^2 + 8G_{23}L_{54}L_{64}L_{71}\kappa\Omega^2 A_{12}^2$ $\quad + 8G_{23}L_{56}L_{64}L_{71}\kappa\Omega^2 A_{12}^2 + 8G_{23}L_{57}L_{64}L_{71}\kappa\Omega^2 A_{12}^2 + 4G_{56}L_{23}L_{54}L_{74}\kappa\Omega^2 A_{12}^2 + 4G_{56}L_{31}L_{54}L_{74}\kappa\Omega^2 A_{12}^2 + 4G_{56}L_{23}L_{57}L_{74}\kappa\Omega^2 A_{12}^2$ $\quad + 4G_{56}L_{31}L_{57}L_{74}\kappa\Omega^2 A_{12}^2 + 4G_{56}L_{23}L_{64}L_{74}\kappa\Omega^2 A_{12}^2 + 4G_{56}L_{31}L_{64}L_{74}\kappa\Omega^2 A_{12}^2 + 8G_{23}L_{54}L_{64}L_{74}\kappa\Omega^2 A_{12}^2 + 8G_{23}L_{56}L_{64}L_{74}\kappa\Omega^2 A_{12}^2$ $\quad + 8G_{23}L_{57}L_{64}L_{74}\kappa\Omega^2 A_{12}^2 + 4G_{23}G_{56}L_{23}L_{57}L_{71}\Gamma_{14}A_{45}A_{12}^2 - 4G_{23}G_{56}L_{31}L_{57}L_{71}\Gamma_{14}A_{45}A_{12}^2 + G_{56}L_{21}L_{31}L_{57}L_{71}\kappa A_{45}A_{12}^2$ $\quad + G_{56}L_{23}L_{31}L_{57}L_{71}\kappa A_{45}A_{12}^2 + G_{23}L_{21}L_{57}L_{64}L_{71}\kappa A_{45}A_{12}^2 + G_{23}L_{31}L_{57}L_{64}L_{71}\kappa A_{45}A_{12}^2 + 4G_{56}L_{23}L_{57}L_{71}\Gamma_{14}\kappa A_{45}A_{12}^2$ $\quad + 4G_{56}L_{31}L_{57}L_{71}\Gamma_{14}A_{45}A_{12}^2 + 8G_{23}L_{57}L_{64}L_{71}\Gamma_{14}\kappa A_{45}A_{12}^2 + G_{23}G_{56}L_{23}L_{57}L_{71}A_{45}^3A_{12} - G_{23}G_{56}L_{31}L_{57}L_{71}A_{45}^3A_{12}$ $\quad + G_{56}L_{23}L_{57}L_{71}\kappa A_{45}^3A_{12} + G_{56}L_{31}L_{57}L_{71}\kappa A_{45}^3A_{12} + 2G_{23}L_{57}L_{64}L_{71}\kappa A_{45}^3A_{12} + 4G_{23}G_{56}L_{23}L_{57}L_{71}\Gamma_{14}A_{45}^2A_{12}$ $\quad - 4G_{23}G_{56}L_{31}L_{57}L_{71}\Gamma_{14}A_{45}^2A_{12} + 2G_{56}L_{23}L_{31}L_{57}L_{71}\kappa A_{45}^2A_{12} + 2G_{56}L_{23}L_{31}L_{57}L_{71}\kappa A_{45}^2A_{12} + 2G_{23}L_{21}L_{57}L_{64}L_{71}\kappa A_{45}^2A_{12}$ $\quad + 2G_{23}L_{31}L_{57}L_{64}L_{71}\kappa A_{45}^2A_{12} + 4G_{56}L_{23}L_{57}L_{71}\Gamma_{14}A_{45}^2A_{12} + 4G_{56}L_{31}L_{57}L_{71}\Gamma_{14}A_{45}^2A_{12} + 8G_{23}L_{57}L_{64}L_{71}\Gamma_{14}A_{45}^2A_{12}$ $\quad + 8G_{23}G_{56}L_{23}L_{54}L_{71}\Gamma_{14}\Omega^2 A_{12} - 8G_{23}G_{56}L_{31}L_{54}L_{71}\Gamma_{14}\Omega^2 A_{12} + 8G_{23}G_{56}L_{23}L_{57}L_{71}\Gamma_{14}\Omega^2 A_{12} - 8G_{23}G_{56}L_{31}L_{57}L_{71}\Gamma_{14}\Omega^2 A_{12}$ $\quad + 8G_{23}G_{56}L_{23}L_{64}L_{71}\Gamma_{14}\Omega^2 A_{12} - 8G_{23}G_{56}L_{31}L_{64}L_{71}\Gamma_{14}\Omega^2 A_{12} + 8G_{23}G_{56}L_{23}L_{54}L_{74}\Gamma_{14}\Omega^2 A_{12} - 8G_{23}G_{56}L_{31}L_{54}L_{74}\Gamma_{14}\Omega^2 A_{12}$ $\quad + 8G_{23}G_{56}L_{23}L_{57}L_{74}\Gamma_{14}\Omega^2 A_{12} - 8G_{23}G_{56}L_{31}L_{57}L_{74}\Gamma_{14}\Omega^2 A_{12} + 8G_{23}G_{56}L_{23}L_{64}L_{74}\Gamma_{14}\Omega^2 A_{12} - 8G_{23}G_{56}L_{31}L_{64}L_{74}\Gamma_{14}\Omega^2 A_{12}$ $\quad + 8G_{56}L_{21}L_{31}L_{54}L_{71}\kappa\Omega^2 A_{12} + 8G_{56}L_{23}L_{31}L_{54}L_{71}\kappa\Omega^2 A_{12} + 8G_{56}L_{21}L_{31}L_{57}L_{71}\kappa\Omega^2 A_{12} + 8G_{56}L_{23}L_{31}L_{57}L_{71}\kappa\Omega^2 A_{12}$ $\quad + 8G_{56}L_{21}L_{31}L_{64}L_{71}\kappa\Omega^2 A_{12} + 8G_{56}L_{23}L_{31}L_{64}L_{71}\kappa\Omega^2 A_{12} + 8G_{23}L_{21}L_{54}L_{64}L_{71}\kappa\Omega^2 A_{12} + 8G_{23}L_{31}L_{54}L_{64}L_{71}\kappa\Omega^2 A_{12}$ $\quad + 8G_{23}L_{21}L_{56}L_{64}L_{71}\kappa\Omega^2 A_{12} + 8G_{23}L_{31}L_{56}L_{64}L_{71}\kappa\Omega^2 A_{12} + 8G_{23}L_{21}L_{57}L_{64}L_{71}\kappa\Omega^2 A_{12} + 8G_{23}L_{31}L_{57}L_{64}L_{71}\kappa\Omega^2 A_{12}$ $\quad + 8G_{56}L_{21}L_{31}L_{54}L_{74}\kappa\Omega^2 A_{12} + 8G_{56}L_{23}L_{31}L_{54}L_{74}\kappa\Omega^2 A_{12} + 8G_{56}L_{21}L_{31}L_{57}L_{74}\kappa\Omega^2 A_{12} + 8G_{56}L_{23}L_{31}L_{57}L_{74}\kappa\Omega^2 A_{12}$ $\quad + 8G_{56}L_{21}L_{31}L_{64}L_{74}\kappa\Omega^2 A_{12} + 8G_{56}L_{23}L_{31}L_{64}L_{74}\kappa\Omega^2 A_{12} + 8G_{23}L_{21}L_{54}L_{64}L_{74}\kappa\Omega^2 A_{12} + 8G_{23}L_{31}L_{54}L_{64}L_{74}\kappa\Omega^2 A_{12}$ $\quad + 8G_{23}L_{21}L_{56}L_{64}L_{74}\kappa\Omega^2 A_{12} + 8G_{23}L_{31}L_{56}L_{64}L_{74}\kappa\Omega^2 A_{12} + 8G_{23}L_{21}L_{57}L_{64}L_{74}\kappa\Omega^2 A_{12} + 8G_{23}L_{31}L_{57}L_{64}L_{74}\kappa\Omega^2 A_{12}$ $\quad + 8G_{56}L_{23}L_{54}L_{71}\Gamma_{14}\kappa\Omega^2 A_{12} + 8G_{56}L_{31}L_{54}L_{71}\Gamma_{14}\kappa\Omega^2 A_{12} + 8G_{56}L_{23}L_{57}L_{71}\Gamma_{14}\kappa\Omega^2 A_{12} + 8G_{56}L_{31}L_{57}L_{71}\Gamma_{14}\kappa\Omega^2 A_{12}$ $\quad + 8G_{56}L_{23}L_{64}L_{71}\Gamma_{14}\kappa\Omega^2 A_{12} + 8G_{56}L_{31}L_{64}L_{71}\Gamma_{14}\kappa\Omega^2 A_{12} + 16G_{23}L_{54}L_{64}L_{71}\Gamma_{14}\kappa\Omega^2 A_{12} + 16G_{23}L_{56}L_{64}L_{71}\Gamma_{14}\kappa\Omega^2 A_{12}$ $\quad + 16G_{23}L_{57}L_{64}L_{71}\Gamma_{14}\kappa\Omega^2 A_{12} + 8G_{56}L_{23}L_{54}L_{74}\Gamma_{14}\kappa\Omega^2 A_{12} + 8G_{56}L_{31}L_{54}L_{74}\Gamma_{14}\kappa\Omega^2 A_{12} + 8G_{56}L_{23}L_{57}L_{74}\Gamma_{14}\kappa\Omega^2 A_{12}$ $\quad + 8G_{56}L_{31}L_{57}L_{74}\Gamma_{14}\kappa\Omega^2 A_{12} + 8G_{56}L_{23}L_{64}L_{74}\Gamma_{14}\kappa\Omega^2 A_{12} + 8G_{56}L_{31}L_{64}L_{74}\Gamma_{14}\kappa\Omega^2 A_{12} + 16G_{23}L_{54}L_{64}L_{74}\Gamma_{14}\kappa\Omega^2 A_{12}$ $\quad + 16G_{23}L_{56}L_{64}L_{74}\Gamma_{14}\kappa\Omega^2 A_{12} + 16G_{23}L_{57}L_{64}L_{74}\Gamma_{14}\kappa\Omega^2 A_{12} + 4G_{23}G_{56}L_{23}L_{54}L_{71}A_{45}\Omega^2 A_{12} - 4G_{23}G_{56}L_{31}L_{54}L_{71}A_{45}\Omega^2 A_{12}$ $\quad + 4G_{23}G_{56}L_{21}L_{56}L_{71}A_{45}\Omega^2 A_{12} + 4G_{23}G_{56}L_{31}L_{56}L_{71}A_{45}\Omega^2 A_{12} + 4G_{23}G_{56}L_{23}L_{57}L_{71}A_{45}\Omega^2 A_{12} - 4G_{23}G_{56}L_{31}L_{57}L_{71}A_{45}\Omega^2 A_{12}$ $\quad - 4G_{23}G_{56}L_{21}L_{64}L_{71}A_{45}\Omega^2 A_{12} + 4G_{23}G_{56}L_{23}L_{64}L_{71}A_{45}\Omega^2 A_{12} - 8G_{23}G_{56}L_{31}L_{64}L_{71}A_{45}\Omega^2 A_{12} + 4G_{23}G_{56}L_{23}L_{54}L_{74}A_{45}\Omega^2 A_{12}$ $\quad - 4G_{23}G_{56}L_{31}L_{54}L_{74}A_{45}\Omega^2 A_{12} + 4G_{23}G_{56}L_{21}L_{56}L_{74}A_{45}\Omega^2 A_{12} + 4G_{23}G_{56}L_{31}L_{56}L_{74}A_{45}\Omega^2 A_{12} + 4G_{23}G_{56}L_{23}L_{57}L_{74}A_{45}\Omega^2 A_{12}$ $\quad - 4G_{23}G_{56}L_{31}L_{57}L_{74}A_{45}\Omega^2 A_{12} - 4G_{23}G_{56}L_{21}L_{64}L_{74}A_{45}\Omega^2 A_{12} + 4G_{23}G_{56}L_{23}L_{64}L_{74}A_{45}\Omega^2 A_{12} - 8G_{23}G_{56}L_{31}L_{64}L_{74}A_{45}\Omega^2 A_{12}$ $\quad + 4G_{56}L_{21}L_{31}L_{57}\kappa A_{45}\Omega^2 A_{12} + 4G_{56}L_{23}L_{31}L_{57}\kappa A_{45}\Omega^2 A_{12} + 4G_{23}L_{21}L_{57}L_{64}\kappa A_{45}\Omega^2 A_{12} + 4G_{23}L_{31}L_{57}L_{64}\kappa A_{45}\Omega^2 A_{12}$ $\quad + 8G_{56}L_{21}L_{31}L_{71}\kappa A_{45}\Omega^2 A_{12} + 8G_{56}L_{23}L_{31}L_{71}\kappa A_{45}\Omega^2 A_{12} + 4G_{56}L_{23}L_{54}L_{71}\kappa A_{45}\Omega^2 A_{12} + 4G_{56}L_{31}L_{54}L_{71}\kappa A_{45}\Omega^2 A_{12}$ $\quad + 4G_{56}L_{23}L_{56}L_{71}\kappa A_{45}\Omega^2 A_{12} + 4G_{56}L_{31}L_{56}L_{71}\kappa A_{45}\Omega^2 A_{12} + 4G_{56}L_{23}L_{57}L_{71}\kappa A_{45}\Omega^2 A_{12} + 4G_{56}L_{31}L_{57}L_{71}\kappa A_{45}\Omega^2 A_{12}$ $\quad + 4G_{23}L_{21}L_{64}L_{71}\kappa A_{45}\Omega^2 A_{12} + 4G_{23}L_{23}L_{54}L_{71}\kappa A_{45}\Omega^2 A_{12} + 4G_{23}L_{31}L_{54}L_{71}\kappa A_{45}\Omega^2 A_{12} + 4G_{56}L_{31}L_{54}L_{71}\kappa A_{45}\Omega^2 A_{12}$ $\quad + 8G_{23}L_{54}L_{64}L_{71}\kappa A_{45}\Omega^2 A_{12} + 8G_{23}L_{56}L_{64}L_{71}\kappa A_{45}\Omega^2 A_{12} + 8G_{23}L_{57}L_{64}L_{71}\kappa A_{45}\Omega^2 A_{12} + 8G_{56}L_{21}L_{31}L_{74}\kappa A_{45}\Omega^2 A_{12}$

FIG. 4

| FIG. 4A |
|---|
| FIG. 4B |
| FIG. 4C |

LASER-BASED SENSOR FOR MEASURING AN EXTERNAL MAGNETIC FIELD

TECHNICAL FIELD

This application claims priority to AU 2015902991, filed Jul. 28, 2015, which is incorporated by reference herein in its entirety.

The present invention relates to a sensor for measuring an external magnetic field. In various embodiments, the invention relates to a magnetometer having a laser medium.

BACKGROUND OF INVENTION

The precise measurement of magnetic fields (magnetometry) has a variety of scientific applications including NMR detection and gravitational wave detection. More generally, it is an enabling technology for mining exploration, to detect gas, oil and mineral reserves, in airports for automated detection of plane movements with less building induced interference than radar, and in medicine for the detection of magnetic fields produced by the heart (magento-cardiography or "MCG") or the brain (magento-encephalography or "MEG").

State of the art sensors with sensitivities around 1 fT/√Hz are the widely used SQUID magnetometers, operated at cryogenic temperatures typically below 10K. The more recently developed spin-exchange relaxation-free (SERF) atomic magnetometers are potentially more sensitive and do not require cryogenic refrigeration but are orders of magnitude larger in size (~1 cm$^3$) and must be operated in a near-zero magnetic field.

It would be desirable to provide a magnetometer which overcomes or at least ameliorates the drawbacks of existing magnetic field sensors.

A reference herein to matter which is given as prior art is not to be taken as an admission that that document or matter was known or that the information was part of the common general knowledge as at the priority date of any of the claims.

SUMMARY OF INVENTION

According to an aspect of the present invention, there is provided a sensor for measuring an external magnetic field, the sensor including: an optical cavity; a laser medium which together with the optical cavity has a laser threshold; a laser pump; and a radio-frequency (RF) drive applied to the laser medium, such that the laser threshold varies with a change in the external magnetic field; wherein the RF drive is applied to the laser medium at or around a particular resonance frequency which varies depending on the external magnetic field, such that depending on the value of the external magnetic field, the RF drive induces transitions between at least two states of the laser medium, each state causing a different laser threshold in an intensity of a laser output; and wherein the intensity of the laser output provides a measurement of the value of the external magnetic field.

In an embodiment, the laser pump is a light source, typically in or close to the visible range, or electrical pumping applied to the laser medium. The laser pump lifts single atoms or single colour centres of the laser medium into an energetically higher lying excited state, from which the laser medium returns to an energetically lower lying state. The energy difference between the two states of the laser medium is emitted as a photon, i.e. light. The photon is created with a wavelength and energy corresponding to the energy difference of the two states.

The laser output may be directly fibre-coupled, i.e. directed into and guided through an optical fibre. This allows the laser output to be guided, for example towards a light detector, which makes it possible to move the sensor around.

The laser pump signal and its fluctuations may be monitored and used in combination with the laser output signal to reduce technical noise. In one form of the invention, the RF drive and its fluctuations are monitored and applied together with a laser output signal to reduce technical noise. The minimisation of technical noise enables more accurate measurements.

According to an embodiment, the laser medium is a solid-state material. Solid-state materials are a reliable option for the laser medium due to their density of emitters, thermal capacity, ease of fabrication and robustness.

One example of a suitable solid-state material is negatively charged nitrogen-vacancy (NV) centres in diamond. This is a naturally occurring diamond impurity, also commonly grown into synthetic diamonds. The suitability of the NV centres as a laser medium is due to the fact that the parameters of the NV centre are well defined and that they have a spin dependent fluorescence. The NV centre laser pumping typically occurs from the electronic ground state triplet $^3A_2$ to the electronic excited state triplet $^3E$. The states of the laser medium causing a different laser threshold in an intensity of a laser output, i.e. different levels of brightness, may be at least two out of the three states of the ground state triplet $^3A_2$. Preferably, at least one of the transitions between the $^3E$ states and the phonon-added states of the $^3A_2$ are used as a lasing transition.

Other examples of suitable solid-state materials for forming the laser medium are silicon-vacancy centres in diamond or Cerium in Yttrium-Aluminium-Garnet.

Preferably, the sensor achieves a sensitivity better than nT/√(Hz). Ideal sensitivity can be achieved by optimisation of various operational parameters.

In some embodiments, the optical cavity includes a diffraction grating. The diffraction grating tunes the optical cavity to be resonant to one or more particular wavelengths which correspond to a particular transition of the laser medium.

According to yet another aspect of the present invention, there is provided a method for measuring the strength of an external magnetic field, the method including the following steps: (a) providing a sensor including a laser pump and a laser medium which together with an optical cavity forms a laser threshold; (b) applying a radio-frequency (RF) drive to the laser medium, such that the laser threshold varies with a change in the external magnetic field; wherein, the RF drive is applied to the laser medium at or around a particular resonance frequency which varies depending on the external magnetic field, such that depending on the strength of the external magnetic field, the RF drive induces transitions between at least two states of the laser medium, each state causing a different laser threshold in an intensity of a laser output; and (c) detecting the intensity of the laser output, wherein the intensity of the laser output provides a measurement of the strength of the external magnetic field.

The method may further include the step of determining the laser output and a sensitivity of the sensor as a function of a plurality of parameters from a steady-state solution to a plurality of differential equations relating to the sensor, wherein a laser pump strength is set to an operating point which is determined from the laser output as a function of the laser pump strength and the sensitivity of the sensor is optimised as a function of a remainder of the plurality of parameters within predefined constraints.

In an embodiment, the method further includes the step of determining a sensor measurement range as a range of detuning between an RF addressed transition frequency and an RF drive frequency above which the output changes as a function of detuning. The laser output is plotted as a function of detuning (or as a function of the physical parameter to be measured) and the sensor measurement range is given by the width of a dip (or peak), typically around zero. The sensor measurement range can accordingly be readily determined for a given set of parameters. The range of possible parameters for a laser threshold sensor is given by the range of parameters for which the laser output as a function of (positive) laser pump strength has a region of non-negative values, i.e. a positive gradient.

In another form of the present invention, a combination of a density of optically active atoms or color centres and a coherence time of the RF addressed transition is selected based on an optimal sensor sensitivity and/or sensor measurement range. Within that optimisation maximum power might place restrictions on the possible range of laser pump rates and/or RF drive strength and a given target of homogeneous power distribution in the laser medium might place restrictions on the range of possible densities of optically active atoms or colour centres.

The loss rate of the cavity is chosen based on the optimal sensor sensitivity and/or sensor measurement range given previous choices of parameters and/or given an optimisation of other parameters. The cavity loss rate can be adapted via the choice of transmittance of the cavity mirrors, i.e. the fraction of light which is transmitted rather than reflected.

The above mentioned parameters are used in the construction of a laser threshold sensor. The subsequently mentioned parameters relate to calibration of the laser threshold sensor.

According to an embodiment, a RF drive strength is selected based on the optimal sensor sensitivity and/or sensor measurement range. Maximal power may restrict the possible range of RF drive strengths.

A laser pump strength may be set to the operating point, wherein the operating point is given by the highest laser threshold as a function of detuning. For laser media where the laser pump together with the internal decay structure drives towards the brighter state, the operating point is given by the laser threshold at zero detuning. The laser pump strength can be set slightly above the operating point to achieve stability and robustness against technical noise. Alternatively, the laser pump strength can be set to a different value below the operating point to achieve better sensitivity over a smaller measurement range.

BRIEF DESCRIPTION OF DRAWINGS

The invention will now be described in further detail by reference to the accompanying drawings. It is to be understood that the particularity of the drawings does not supersede the generality of the preceding description of the invention.

FIGS. 4A-4C (collectively, "FIG. 4") are the solution to Equation 3.

DETAILED DESCRIPTION

Figure 1:
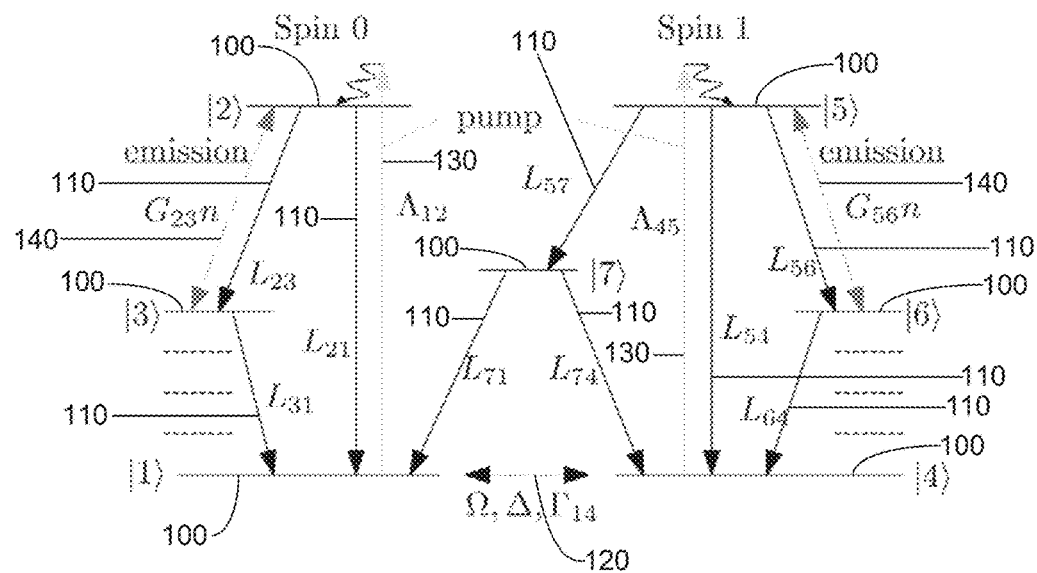
FIG. 1 is a schematic representation of the states of an NV centre as an example of a suitable laser medium according to an embodiment of the present invention.

As used throughout this specification, the term "laser threshold" or "lasing threshold" refers to the point of laser pumping above which the laser turns on, and below which the laser turns off. "On" means that self-sustained lasing occurs and coherent laser light is emitted continuously.

A "laser" as referred to herein, consists of at least a laser medium, a cavity and a laser pump, which is typically a light source or electrical pumping, which is applied to the laser medium.

A "radio-frequency drive" or "RF drive" as referred to herein is an antenna or wire emitting electro-magnetic waves in the radio-frequency region.

The term "resonance frequency" as used throughout this specification with respect to a laser medium is intended to refer to a transition frequency corresponding to the energy difference of at least two states of the laser medium. If an external drive at that frequency is applied to the laser medium it induces transitions between those (at least) two states. For any transition the resonance frequency is the centre frequency of a resonance peak. The peak width of the resonance peak is referred to as the broadening of the transition.

The term "vibronic states" refers to the states with added phonons, which are very short-lived.

A laser consists of at least a laser medium, a cavity and a laser pump, which is typically a light source, typically in or close to the visible range or electrical pumping, which is applied to the laser medium. The laser pump lifts single atoms or single colour centres of the laser medium into an energetically higher lying excited state. From this excited state the laser medium returns to an energetically lower lying state; the energy difference is emitted as light (a photon). The photon is created with a wavelength and energy corresponding to that energy difference of the two states. The lower lying energy state has multiple states slightly higher in energy because they have an additional phonon (vibrational quantum). Since transitions can also go from the higher lying state to these phonon-added states the photon that is created can have a range of different wavelengths, the so-called phonon sidebands. Spontaneous emission emits photons over this range of wavelength. Stimulated emission emits photons in only one wavelength (i.e. a much smaller range of wavelengths), namely that wavelength of the strong field which creates stimulated emission. This wavelength corresponds to one particular transition in the laser medium. This transition is called the lasing transition.

The process of pumping to an excited state followed by the emission of a photon is continuously repeated by the atoms or colour centres of the laser medium. The photon emission can either be spontaneous emission or stimulated emission. Stimulated emission occurs when a light field interacts with the atom or colour centre and is more likely the stronger the light field; the emitted photon under stimulated emission has the same wavelength, phase and spatial mode as the strong light field. The laser cavity essentially consists of at least two mirrors surrounding the laser medium, one of which is partially transmitting. The emitted light is reflected back and forth between the mirrors and builds up a light field which in turn creates stimulated emission. This light field continuously gains photons from the laser medium but also continuously loses photons due to the partially transmitting mirror. Lasing is achieved, when the stimulated emission becomes strong enough to counteract the cavity loss and builds up a strong light field inside the cavity. For a given number of atoms or colour centres and a given transmittance of the mirror, there is a minimal strength of the laser pump needed to achieve lasing. This is called the laser threshold or lasing threshold. When the laser pump strength is above the laser threshold lasing is achieved, i.e. the laser turns on. This is because the light field inside the cavity is strong and creates stimulated emission. Some of this light is transmitted through the partially transmitting mirror and creates the laser beam of light, i.e. the laser output.

An atom or colour centre has separate states with different energies. A transition between at least two states can be induced by applying electromagnetic waves to the atom or colour centre, with a frequency which corresponds to the energy difference between those states. Since inducing transitions is dependent on applying a particular frequency it is a resonance phenomenon. Transitions between states with different spin are typically induced by frequencies in the radio-frequency (RF) range. This is called magnetic resonance. States with different spin also have an energy difference (and hence a resonance frequency) which is dependent on the value of an external magnetic field. Inducing transitions is therefore dependent both on the frequency and the external magnetic field.

Magnetic resonance is used widely for example in medical imaging and spectroscopy. When the two different spin states have a different brightness under excitation from another pump light source, then the transitions can be detected by measuring the brightness. This is called optically detected magnetic resonance (ODMR). Conventionally, ODMR is based purely on spontaneous emission.

The present invention combines the principles of lasing and magnetic resonance to create a laser threshold sensor with exceptional sensitivity. A laser with a particular laser medium is combined with an RF drive in such a way that the laser threshold shifts when the external magnetic field changes. For a laser threshold sensor to operate, a laser medium must satisfy three requirements.

The first requires that the laser medium has at least two states with an energy difference which changes with the external magnetic field to be measured (or more generally: with the external quantity to be measured). For example different spin states have an energy difference which changes with the magnetic field. The RF drive is applied to the transition between these states.

The second requires that the at least two states which are addressed by the RF drive have different brightness under laser pumping. The difference in brightness means that depending on the resonance of the RF drive there are different gains into the cavity, which shifts the laser threshold.

The third requires that the laser pump together with the internal decay structure of the laser medium drives the laser medium preferentially into one of the two RF addressed states which have different brightness. This way the laser pump and the RF drive work against each other and off-resonant RF driving results in the laser medium being driven into the preferential state (which is defined by the laser pump and the internal decay structure) rather than staying in an arbitrary state. Only on-resonant RF driving creates a transition into the non-preferential state. The third feature is often equivalent to (and therefore present in materials which have) a mechanism of optical initialisation in the context of qubits.

Solid-state materials are often a good choice for the laser medium due to their density of emitters, thermal capacity, ease of fabrication and robustness. One example of a suitable solid-state laser medium satisfying the foregoing requirements are nitrogen-vacancy colour centres (NV centres) in a diamond crystal. This is a diamond impurity that can be naturally found, or more commonly grown into synthetic diamonds. The suitability of the NV centre as a laser medium is due to the fact that the parameters of the NV centre are well defined and it has a spin dependent fluorescence, i.e. it emits different amounts of light depending on the spin state it is in. In the NV centre the $m_s=0$ spin manifold is brighter than the $m_s=\pm 1$ spin manifolds and the NV centre is driven into the $m_s=0$ spin state by a laser pump together with the internal decay structure.

The laser threshold is determined by the number of photons which are emitted on the lasing transition relative to the number of photons lost from the cavity. The fraction of photons lost is determined by the transmittance of the mirrors and unwanted scattering processes. The number of photons emitted on the lasing transition is determined by the number of atoms or colour centres, the strength of the laser pump and the probability of photon emission into the cavity mode (i.e. the brightness of the lasing transition) of one atom or colour centre for a given laser pump strength. That means that the laser threshold changes when the brightness of the laser medium on the lasing transition changes (for fixed laser pump strength).

The external magnetic field changes the energy difference, i.e. resonance frequency between two states. If the RF drive frequency is fixed, the external magnetic field shifts the RF drive on and off resonance, which determines the relative probability of the state that the laser medium is predominantly in. The different states are associated with different brightness, which creates a different lasing threshold. Therefore the lasing threshold changes with the external magnetic field. This means that the laser output provides a measurement of the magnetic field.

A measurement can be obtained in different ways. One way is to sweep through the RF frequency and to record the laser output as a function of the RF frequency. This provides a plot with at least one resonance peak (or dip, i.e. inverted peak). The position of that at least one peak yields information about the external magnetic field. In cases where there are several peaks their relative position, height and width can provide further information. For example for laser media with branching ratios, which depend on the orientation of the magnetic field the relative height of different peaks can yield precise information about the orientation of the magnetic field. Sweeping the RF frequency has the advantage of recording a spectral profile, which can either be advantageous to determine a resonance frequency to very high precision or is particularly advantageous, in cases where the additional information is in the spectral profile, such as cases with several peaks. Another way of obtaining a measurement is by fixing the RF drive to a certain frequency. This has the advantage, that the laser output measurement can be obtained either much faster (since it is not necessary to scan the RF frequency range) and/or to higher precision at the fixed RF frequency (since the laser output intensity can be measured for longer).

Referring now to FIG. 1, there are shown the relevant states 100 of an NV centre, which is an exemplary laser medium for laser threshold magnetometry. The vertical height implies the relative energy level of the state 100. The downwards pointing arrows 110 represent internal decay rates of the NV. States 1, 2, 3 are the $m_s=0$ spin manifold, states 4, 5, 6 are the $m_s=1$ (or $-1$) manifold. The RF drive addresses transitions between states 1 and 4 (two-way horizontal arrow 120). The laser pump lifts the NV from the lower lying energy state 1 or 4 to the excited state 2 and 5 (upwards arrows 130), often via phonon-added states above 2 and 5. Above the ground states (1 and 4) there are several phonon-added states (indicated by dotted lines and states 3 and 6). The lasing transition (arrows 140) is chosen between the excited state and a phonon-added state. The intrinsic asymmetry created by the transitions $L_{57}$ and $L_{71}$ ensures that under continuous laser pumping (without the RF drive) the system is driven towards the spin 0 manifold. The decay rate $L_{57}$ also means that the likelihood of emitting a photon from state 5 is lower than from state 2, i.e. that the spin manifolds have different brightness.

Figure 2:
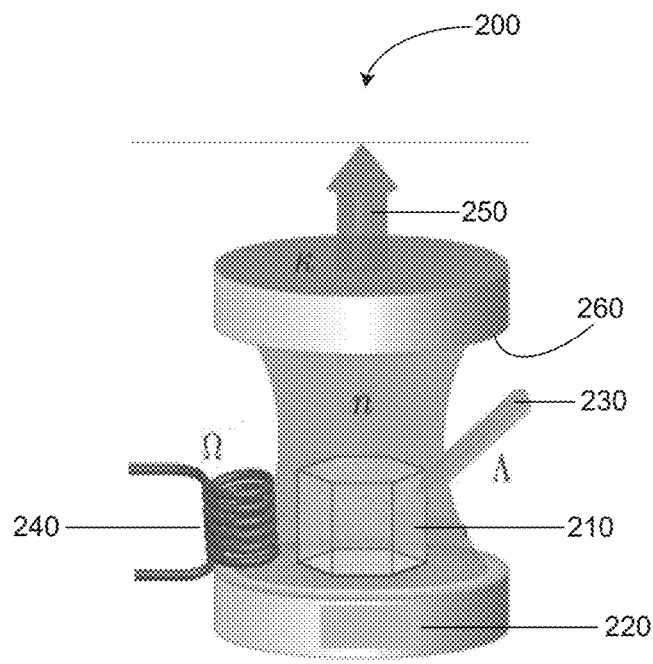
FIG. 2 is a schematic representation of the laser threshold sensor.

Referring now to FIG. 2, there is shown the configuration of a laser threshold sensor 200 showing the primary components. A laser medium 210 is positioned inside a cavity 220, a laser pump 230, an RF drive 240 (e.g. a wire or coil). Above the laser threshold, stimulated emission from the laser medium occurs. At equilibrium there are n photons of the same wavelength, emitted from the lasing transition occurring inside the cavity 220. A partially transmitting mirror 260 lets a certain fraction of the photons escape the cavity 220. These escaping photons form the laser beam 250, i.e. the laser output.

To achieve lasing, a population inversion is necessary, i.e. the laser medium 210 needs to be more likely in the upper state of the lasing transition than the lower state of the lasing transition. The fast spontaneous decay from the excited state to the ground state in many laser media 210 makes population inversion on the transition between the excited and ground state very difficult because the laser pump 230 has to be strong enough to counteract the spontaneous decay. To achieve lasing, the lasing transition can be chosen to be between the excited state and a phonon-added ground state. This means that for lasing population inversion between the phonon-added ground state and the excited state is necessary instead of population inversion between the absolute ground state and the excited state. Since the phonons decay very quickly the population in the phonon-added ground state is very small and population inversion can be achieved much more easily. In the NV centre for example this is the case (see FIG. 1). The lasing transition is ideally chosen between the excited state and that phonon-added ground state which has the strongest transition, i.e. is the brightest. This transition is given by the peak of the phonon-sideband, which for the example of an NV centre is at approximately 700 nm and corresponds to the three-phonon-added ground state. However, any of the phonon added states could be used.

The NV centre laser pumping occurs from the electronic ground state triplet $^3A_2$ to the electronic excited state triplet $^3E$, where $A_1$, $A_2$, and E refer to the group theoretical irreducible representations of the $C_{3V}$ symmetry group of the NV centre. The states with different levels of brightness are at least two out of the three states of the ground state triplet $^3A_2$. At least one of the transitions between the $^3E$ states and the phonon-added states of the $^3A_2$ are used as a lasing transition.

Figure 3:
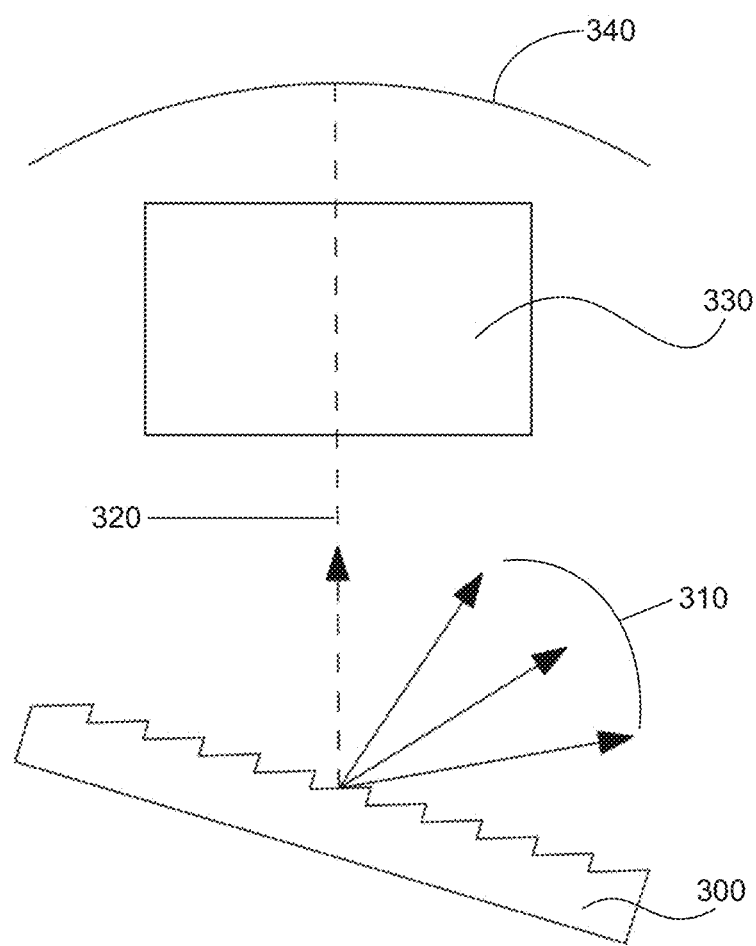
FIG. 3 is a schematic representation of a laser cavity which includes a diffraction grating.

To enforce that lasing transition the cavity 220 can be chosen resonant to that transition optionally with the help of a diffraction grating as shown in FIG. 3. Light that hits the grating 300 is diffracted towards different angles 310 and 320 corresponding to different wavelengths. Therefore only certain predetermined wavelength or wavelengths 320 are reflected back into the cavity by grating 300. That is, the cavity is only resonant to that particular wavelength. A diffraction grating 300 can therefore be used to tune the resonance of a cavity to a (or several) particular wavelength, corresponding to a particular transition of the laser medium 330.

Lasing (population inversion) on the transition of states 1 to 2 and 4 to 5 is close to impossible due to the fast decay. Lasing on the transition 2 to 3 and 5 to 6 is achievable because the fast decay rates $L_{31}$ and $L_{64}$ ensure that the population in states 3 and 6 is low.

Furthermore the lasing threshold is lowered to an achievable value by decreasing the laser cavity loss rate, increasing the number of atoms or colour centres, and choosing a laser medium with a low decoherence rate and relaxation rate on the RF addressed transition. The cavity loss rate is decreased by reducing the transmission of the cavity mirrors as well as minimising scattering and losses inside the cavity. For the example of NV centres, a diamond with high NV density (and/or a large diamond volume) but also with a long inhomogeneous coherence time $T_2^*$ is advantageous. A long coherence time can be achieved by using isotopically purified diamond and ensuring a high conversion efficiency from N to NV for example by appropriate annealing. Qualitative details (and quantitative details for the example of NV centres in diamond) to achieve lasing follow further below.

The differential equations which describe the laser threshold magnetometer with NV centres in diamond corresponding to the example in FIG. 1 are as follows:

$$\dot{\rho}_{11}=-2\Omega Im(\rho_{14})-\Lambda_{12}\rho_{11}+L_{21}\rho_{22}+L_{31}\rho_{33}+L_{71}\rho_{77},$$

$$\dot{\rho}_{14}=(i\Delta-\Gamma_{14}-\Lambda_{12}/2-\Lambda_{45}/2)\rho_{14}-i\Omega(\rho_{44}-\rho_{11}),$$

$$\dot{\rho}_{22}=\Lambda_{12}\rho_{11}-(L_{21}+L_{23})\rho_{22}-G_{34}(\rho_{22}-\rho_{33})n,$$

$$\dot{\rho}_{33}=L_{23}\rho_{22}-L_{31}\rho_{33}-G_{23}(\rho_{33}-\rho_{22})n,$$

$$\dot{\rho}_{44}=2\Omega Im(\rho_{14})-\Lambda_{45}\rho_{44}+L_{54}\rho_{55}+L_{64}\rho_{66}+L_{74}\rho_{77},$$

$$\dot{\rho}_{55}=\Lambda_{45}\rho_{44}-(L_{54}+L_{56}+L_{57})\rho_{55}-G_{56}(\rho_{55}-\rho_{66})n,$$

$$\dot{\rho}_{66}=L_{56}\rho_{55}-L_{64}\rho_{66}-G_{56}(\rho_{66}-\rho_{55})n,$$

$$\dot{\rho}_{77} = L_{57}\rho_{55} - (L_{71} - L_{74})\rho_{77},$$

$$\dot{n} = G_{23}(\rho_{22} - \rho_{33})n + G_{56}(\rho_{55} + \rho_{66})n - \kappa n, \quad \text{(Equations 1)}$$

where $\rho_{jj}$ is the diagonal density matrix element corresponding to state j of FIG. 1, $\rho_{14}$ is the off-diagonal density matrix element between states 1 and 4, the $\Lambda_{jk}$ represent the effective incoherent pumping rates from the green laser pump, which model the coherent excitation to a phonon-added state just above states 2 and 5, followed by a rapid decay into states 2 and 5. The $L_{jk}$ are the incoherent decay rates within the NV centre and the $G_{jk}$ the coherent (cavity induced) transitions. The strength of the RF drive is given by $\Omega$, which is the Rabi frequency, which has detuning $\Delta$, whilst $\Gamma_{14}$ is the ground-state decoherence. Finally n is the number of intracavity photons per NV centre, $\kappa$ is the photonic loss rate from the cavity. Equations 1 (and similar equations for any other laser medium) are non-linear if n is considered a variable. A solution as a function of time can be obtained numerically for any example, where all parameters are set to numerical values. An analytical solution can be obtained for the steady-state solution (i.e. all time-derivatives are zero). For the steady-state solution n can be assumed to be constant. The differential equations for the density matrix elements as a function of n are then linear equations and can be written as a matrix multiplication, where the matrix contains only the coefficients. These linear equations are solved analytically by diagonalisation of the matrix or solving for the nullspace of the matrix. The unnormalised steady state solution for the density matrix elements in Equations 1 is:

$$\begin{pmatrix} \frac{iL_{71}(\beta + 2\Gamma_{14} + 2i\Delta)}{2(\beta + 2\Gamma_{14})\Omega} \\ -\frac{iL_{71}(\beta + 2\Gamma_{14} - 2i\Delta)}{2(\beta + 2\Gamma_{14})\Omega} \\ 4(L_{71} + L_{74})(L_{64}(L_{56} + G_{56}n) + L_{54}(L_{64} + G_{56}n)) \\ (\beta + 2\Gamma_{14})\Omega^2 + L_{57}(L_{64} + G_{56}n) \\ (4L_{74}(\beta + 2\Gamma_{14})\Omega^2 + L_{71}(\beta^2\Lambda_{45} + \\ 4\beta(\Gamma_{14}\Lambda_{45} + \Omega^2) + 4(\Gamma_{14}^2\Lambda_{45} + \Delta^2\Lambda_{45} + 2\Gamma_{14}\Omega^2))) \\ \overline{4L_{57}(L_{64} + G_{56}n)(\beta + 2\Gamma_{14})\Lambda_{45}\Omega^2} \\ (L_{31} + G_{23}n)\Lambda_{12}(4(L_{71} + L_{74})(L_{64}(L_{56} + G_{56}n) + \\ L_{54}(L_{64} + G_{56}n))(\beta + 2\Gamma_{14})\Omega^2 + L_{57}(L_{64} + G_{56}n) \\ (4L_{74}(\beta + 2\Gamma_{14})\Omega^2 + L_{71}(\beta^2\Lambda_{45} + 4\beta(\Gamma_{14}\Lambda_{45} + \Omega^2) + \\ 4(\Gamma_{14}^2\Lambda_{45} + \Delta^2\Lambda_{45} + 2\Gamma_{14}\Omega^2)))) \\ \overline{4L_{57}(L_{64} + G_{56}n)(L_{31}(L_{23} + G_{23}n) + \\ L_{21}(L_{31} + G_{23}n))(\beta + 2\Gamma_{14})\Lambda_{45}\Omega^2} \\ (L_{23} + G_{23}n)\Lambda_{12}(4(L_{71} + L_{74})(L_{64}(L_{56} + G_{56}n) + \\ L_{54}(L_{64} + G_{56}n))(\beta + 2\Gamma_{14})\Omega^2 + L_{57}(L_{64} + G_{56}n) \\ (4L_{74}(\beta + 2\Gamma_{14})\Omega^2 + L_{71}(\beta^2\Lambda_{45} + 4\beta(\Gamma_{14}\Lambda_{45} + \Omega^2) + \\ 4(\Gamma_{14}^2\Lambda_{45} + \Delta^2\Lambda_{45} + 2\Gamma_{14}\Omega^2)))) \\ \overline{4L_{57}(L_{64} + G_{56}n)(L_{31}(L_{23} + G_{23}n) + \\ L_{21}(L_{31} + G_{23}n))(\beta + 2\Gamma_{14})\Lambda_{45}\Omega^2} \\ (L_{71} + L_{74})(L_{56}L_{64} + L_{57}L_{64} + \\ \frac{G_{56}L_{57}n + G_{56}L_{64}n) + L_{54}(L_{64} + G_{56}n))}{L_{57}(L_{64} + G_{56}n)\Lambda_{45}} \\ \frac{L_{71} + L_{74}}{L_{57}} \\ \frac{(L_{71} + L_{74})(L_{56} + G_{56}n)}{L_{57}(L_{64} + G_{56}n)} \\ 1 \end{pmatrix} \quad \text{(Equation 2)}$$

where the order in the above vector is:

$$\begin{pmatrix} \rho_{14} \\ \rho_{41} \\ \rho_{11} \\ \rho_{22} \\ \rho_{33} \\ \rho_{44} \\ \rho_{55} \\ \rho_{66} \\ \rho_{77} \end{pmatrix}$$

At equilibrium the laser output is given by the steady-state solution for n. An independent equation for the steady-state solution of n is obtained by inserting the normalised steady-state solutions for the density matrix elements in the differential equation for n and setting the time derivative to zero. The steady-state solution for n is then given by the solution to this equation, which (for Equations 1) is given by:

$$\kappa = G(\rho_{22}(n) - \rho_{33}(n) + \rho_{55}(n) - \rho_{66}(n)) \quad \text{(Equation 3)}$$

where $\kappa$ is the loss rate of the cavity, G is the coefficient of the stimulated emission rate and the $\rho_{jj}(n)$ are the probabilities of the laser medium being in state j (see FIG. 1) as a function of the number n of photons in the cavity per NV centre. These probabilities $\rho_{jj}(n)$ are given by the normalised steady state solution to the differential equations shown as Equations 1 above.

Equation 3 (or a similar equation for any other laser medium) is a single equation for a single variable and does not contain any derivatives of that variable any more. It can be solved numerically by well-known numerical routines. It can be solved analytically by appropriate analytical routines, such as 'Solve' in 'Wolfram Mathematica'. The analytical solution to Equation 3 is shown as FIG. 4.

The expression allows calculation of the laser threshold and the laser output as a function the external magnetic field to be measured for any set of given parameters.

Figure 4B:
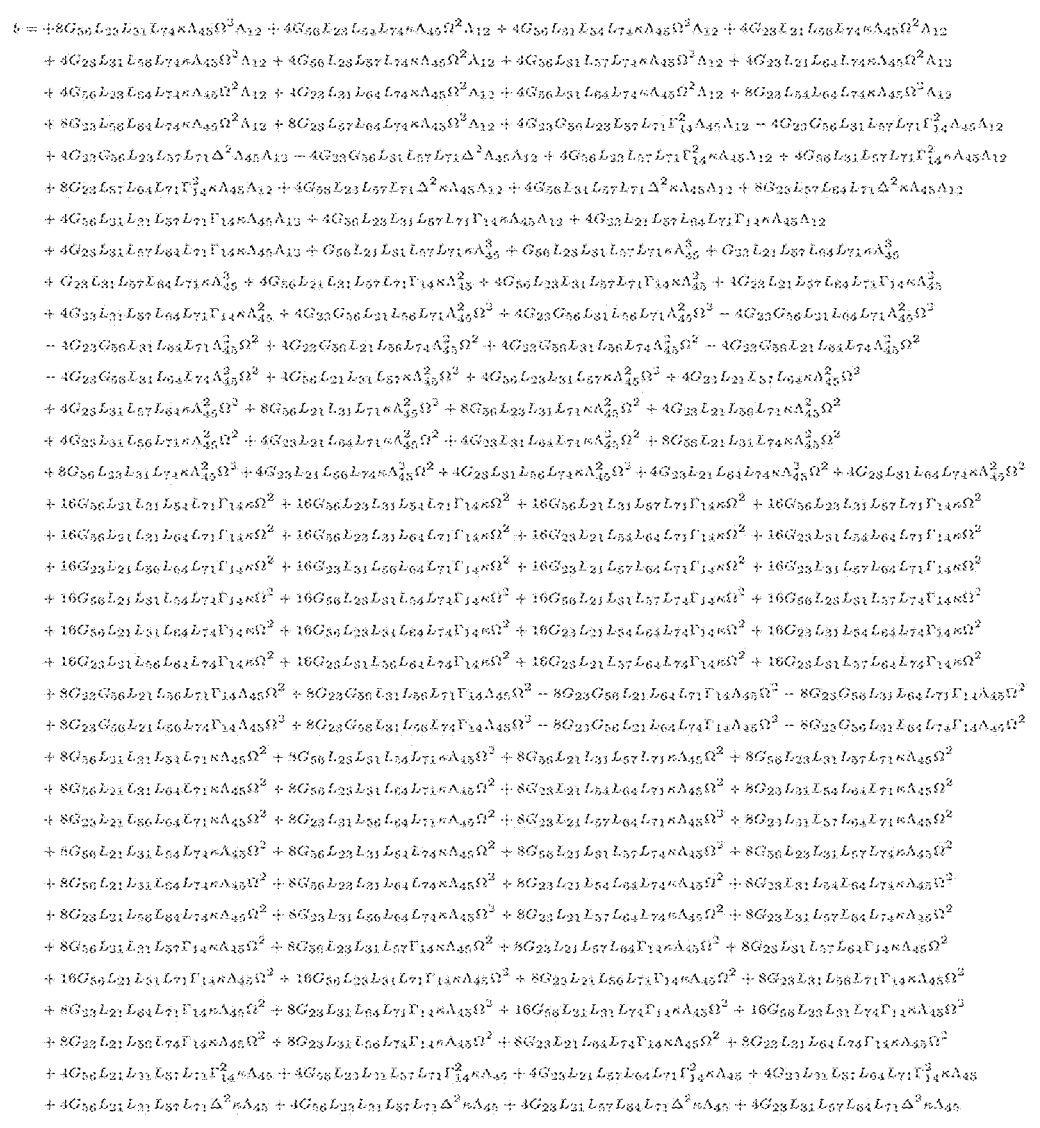

When the values of the internal decay rates of the NV centre, which are known in the literature, are inserted, the long equation FIG. 4 simplifies strongly. The known internal decay rates are as follows. The decay rate $L_{23}$ to the three-phonon-added state is 18 MHz, the all other decays are grouped into the rate $L_{31}$ which is 1/(11.6 ns)−18 MHz=68 MHz, the phonon-decay rate $L_{41}$ is very large and approximately 1 THz, the corresponding rates in the other spin manifold are the same: $L_{56} = L_{23}$, $L_{54} = L_{21}$, $L_{64} = L_{31}$. The rate $L_{57}$ effectively combines the transition to the excited singlet state and from there to the singlet ground state and is 1/(24 ns+0.9 ns)=40 MHz. The rate $L_{71}$ is 1/462 ns=2.2 MHz and the rate $L_{74} = L_{71}/2$. Furthermore, one can set $G_{23} = G_{56} = G$ and $\Lambda_{12} = \Lambda_{45} = \Lambda$. With these parameters FIG. 4 simplifies to:

$n = (2.49996 \times 10^{11}(-1.00017 \times 10^{12}\Gamma_{14}^2\kappa\Lambda - 1.00017 \times 10^{12}\Delta^2\kappa\Lambda + 1 \cdot G\Gamma_{14}^2\Lambda^2 + 1 \cdot G\Lambda^2\Delta^2 - 2.00034 \times 10^{12}\Gamma_{14}^2\kappa\Lambda^2 - 3.00007\Gamma_{14}^2\kappa\Lambda^2 - 3.00007\Delta^2\kappa\Lambda^2 + 2 \cdot G\Gamma_{14}^2\Lambda^3 - 1.00017 \times 10^{12}\kappa\Lambda^3 - 6.00014\Gamma_{14}\kappa\Lambda^3 + 1 \cdot G\Lambda^4 - 3.00007\kappa\Lambda^4 - 3.17619 \times 10^{13}\Gamma_{14}\kappa\Omega^2 + 149413 \cdot G\Gamma_{14}\Lambda\Omega^2 - 3.17619 \times 10^{13}\kappa\Lambda\Omega^2 - 1.07361 \times 10^6\Gamma_{14}\kappa\Lambda\Omega^2 + 149413 \cdot G\Lambda^2\Omega^2 - 1.07361 \times 10^6\kappa\Lambda\Omega^2 + 2.876 \times 10^{-27}((\Gamma_{14}^2\Lambda(\kappa(-3.47765 \times 10^{38} - 1.04314 \times 10^{27}\Lambda) + 3.47705 \times 10^{26}G\Lambda) + \Gamma_{14}(6.9541 \times 10^{26}G\Lambda^3 + 5.19517 \times 10^{31}G\Lambda\Omega^2 + \kappa(-6.9553 \times 10^{38}\Lambda^2 - 2.08628 \times 10^{27}\Lambda^3 - 1.10438 \times 10^{40}\Omega^2 - 3.73299 \times 10^{32}\Lambda\Omega^2)) + \Lambda(3.47705 \times 10^{26}G\Lambda^3 + \Delta^2(\kappa(-3.47765 \times 10^{38} - 1.04314 \times 10^{27}\Lambda) + 3.47705 \times 10^{26}G\Lambda) + 5.19517 \times 10^{31}G\Lambda\Omega^2 + \kappa(-3.47765 \times 10^{38}\Lambda^2 - 1.04314 \times$ $10^{27}\Lambda^3-1.10438\times10^{40}\Omega^2-3.73299\times10^{32}\Lambda\Omega^2)))$
$^2-9.67242\times10^{52}\kappa(\Gamma_{14}{}^2\Lambda(5.00034\times\kappa10^{11}+1\cdot\Lambda)+$
$\Gamma_{14}(1.00007\times10^{12}\Lambda^2+2\cdot\Lambda^3+7.47132\times10^{16}\Omega^2+$
$611445\cdot\Lambda\Omega^2)+\Lambda(5.00034\times10^{11}\Lambda^2+1\cdot\Lambda^3+\Lambda^2$
$(5.00034\times10^{11}+1\cdot\Lambda)+7.47132\times10^{16}\Omega^2+$
$611445\cdot\Lambda\Omega^2))(\Gamma_{14}{}^2\Lambda(-0.999964\Lambda G+\kappa(8.62053\times$
$10^7+1\cdot\Lambda))+\Gamma_{14}(-1.9999G\Lambda\Omega^2+\kappa(1.72411\times$
$10^8\Lambda^2+2\cdot\Lambda^3+1.6275\times10^9\Omega^2+95.533\Lambda\Omega^2))+\Lambda(-$
$0.999964\Lambda^3+\Lambda^2(-0.999964G\Lambda-\kappa(8.62053\times10^7+$
$1\cdot\Lambda))-15.8787G\Lambda\Omega^2+\kappa(8.62053\times10^7\Lambda^2+1\cdot\Lambda^3+$
$1.6275\times10^9\Omega^2+95.533\Lambda\Omega^2))))))/(G\kappa(\Gamma_{14}{}^2\Lambda$
$(5.00034\times10^{11}+1\cdot\Lambda)+\Gamma_{14}(1.00007\times10^{12}\Lambda^2+$
$2\cdot\Lambda^3+7.47132\times10^{16}\Omega^2+611445\cdot\Lambda\Omega^2)+\Lambda$
$(5.00034\times10^{11}\Lambda^2+1\cdot\Lambda^3+\Lambda^2(5.00034\times10^{11}+1\cdot\Lambda)+$
$7.47132\times10^{16}\Omega^2+611445\cdot\Lambda\Omega^2)))$ The laser output $P_{out}$ in Watt is linearly proportional to n. It is given by:

$$P_{out}=2\pi n N_{at}\kappa\hbar\nu_{23} \quad \text{(Equation 4)}$$

where $N_{at}$ is the number of optically active atoms or colour centres inside the cavity, $\nu_{23}$ the transition frequency corresponding to the energy difference between the states 2 and 3, as well as 5 and 6, referring to FIG. 1.

To consider the effect of the occurrence of all four possible orientations of NV centres in a single crystal the equation for n can be adapted to:

$$\kappa=\tfrac{1}{4}G(\rho_{a22}(n)-\rho_{a33}(n)+\rho_{a55}(n)-\rho_{a66}(n))+\tfrac{3}{4}G(\rho_{m22}(n)-\rho_{m33}(n)+\rho_{m55}(n)-\rho_{m66}(n)) \quad \text{(Equation 5)}$$

where $\rho_{aij}(n)$ refers to the ideally aligned direction, and $\rho_{mij}(n)$ refers to the other three misaligned directions. Both are the steady state solution to the respective equations (Equation 1) where the detuning and RF drive strength are adapted to the effective values for the aligned or misaligned direction, given for both by:

$$\Delta_{eff}=\varepsilon-\sqrt{(\varepsilon+b_z)^2+b_x^2} \quad \text{(Equation 6)}$$

$$\Omega_{eff}=\frac{b_z}{\sqrt{b_z^2+b_x^2}}\Omega_x-\frac{b_x}{\sqrt{b_z^2+b_x^2}}\Omega_z \quad \text{(Equation 7)}$$

where $\varepsilon$ is the zero-field splitting, $b_j$ the angular frequency corresponding to the magnetic field component j, $\Omega_j$ the angular frequency corresponding to the RF drive component j, and subscript z refers to the component along the direction of the NV axis and x refers to the perpendicular component. For the aligned orientation $b_z=b$ and $b_x=0$. For the misaligned directions $b_z=b\cos(180°-\alpha)$ and $b_x=b\sin(180°-\alpha)$, where $\alpha\approx109.5°$ is the tetrahedral angle. Equation 5 can be solved both analytically and numerically in the same way as Equation 3.

With a computer these calculations are very fast and provide the tool to determine the range of possible parameters for a working laser threshold magnetometer with NV centres as the laser medium. They enable optimisation of the parameters to achieve best sensitivity. A detailed analysis of possible parameters and optimisation is provided below. An example set of parameters which work well and achieve good precision are exemplified in FIGS. 5, 6, 7 and 10.

In the examples that follow, NV centres in diamond are utilised as the laser medium. The intrinsic decay rates of NV centres in diamond are known in the literature:

$$L_{23}=L_{56}=18\text{ MHz},L_{31}=L_{64}=1\text{THz},L_{21}=L_{54}=68.2$$
$$\text{MHz},L_{74}=(462\text{ ns})^{-1},L_{71}=L_{74}/2 \text{ and } L_{57}=(24.9$$
$$\text{ns})^{-1},G_{23}=G_{56}=G,\Lambda_{12}=\Lambda_{45}=\Lambda \quad \text{(Equation 8)}$$

furthermore $G$ is given by:

$$G=3\nu_{23}L_{23}\lambda^3N_{at}/(4\pi^2\Delta\nu_{23}V_c) \quad \text{(Equation 9)}$$

where $\lambda$ is the wavelength of the emitted light in the medium, $\Delta\nu_{23}$ is the width of the atomic transition and $V_c$ is the cavity volume.

Figure 5:
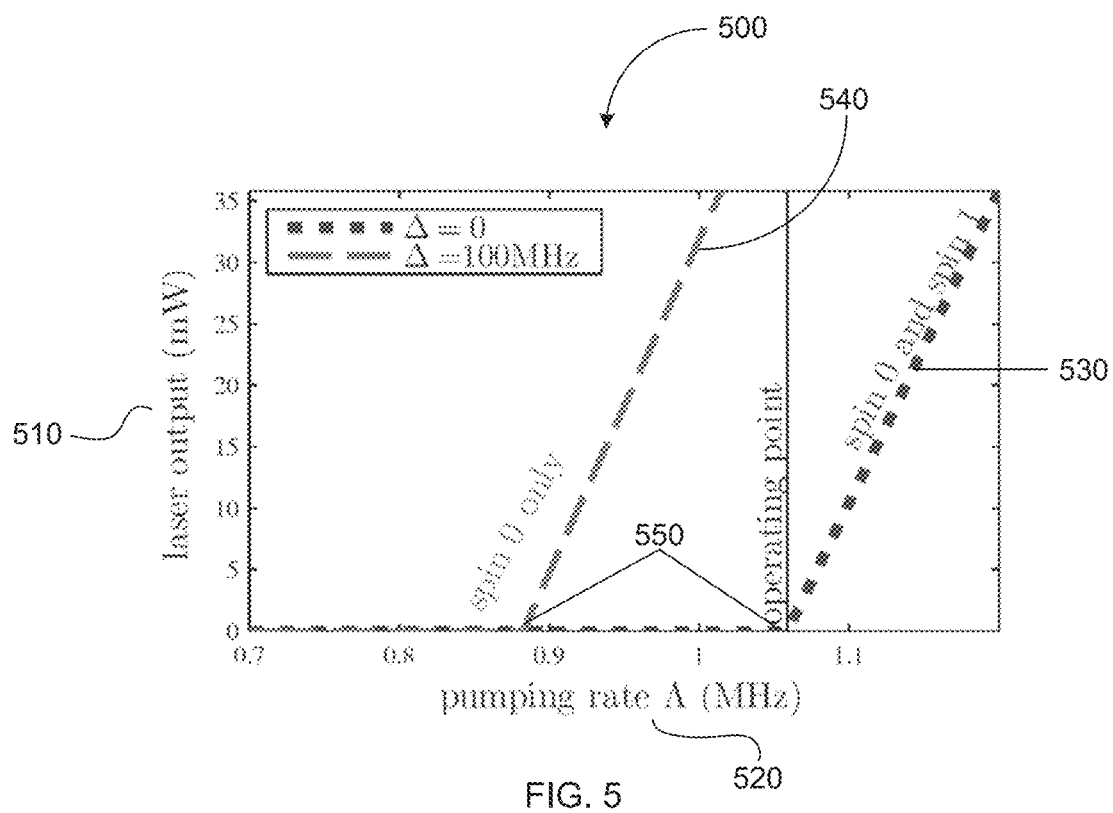
FIG. 5 is a plot showing the laser output power as a function of the laser pump rate for an exemplary laser magnetometer based on NV centres according to an embodiment of the present invention.
Figure 6:
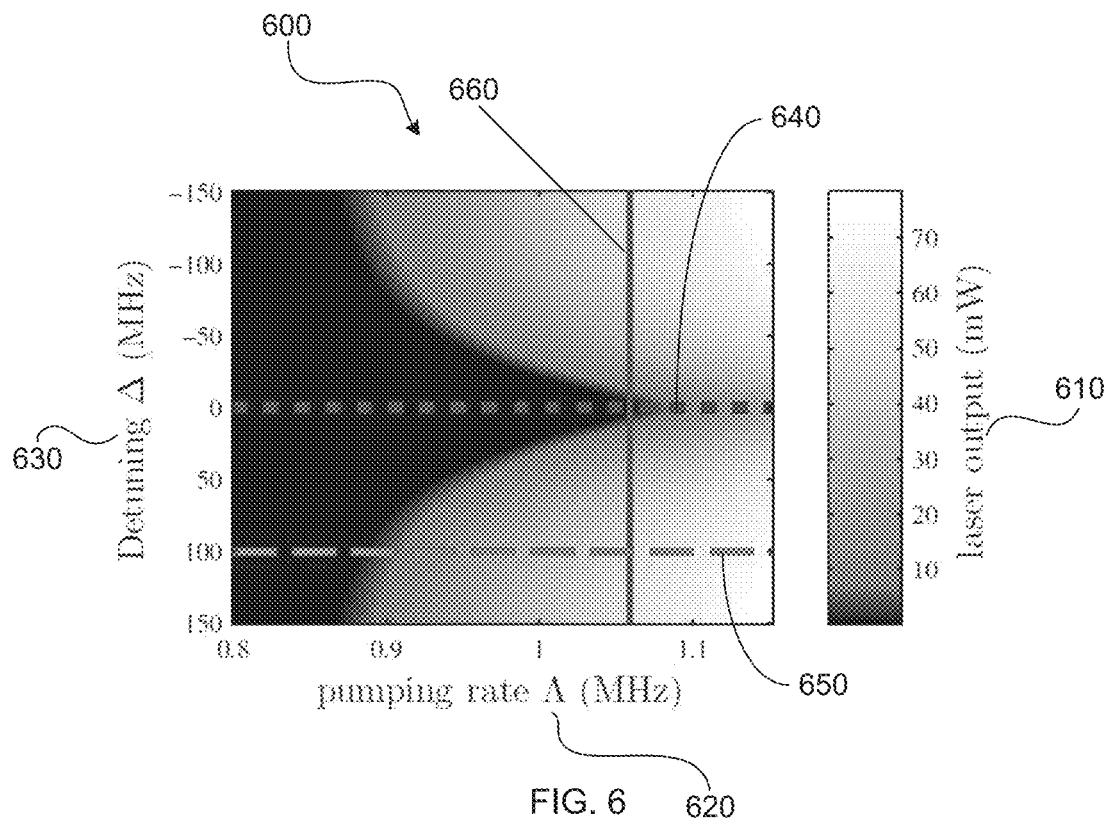
FIG. 6 is a plot showing the laser output power as a function of the laser pump rate and detuning, i.e. the frequency difference between the RF drive and the lasing transition according to an exemplary embodiment.
Figure 7:
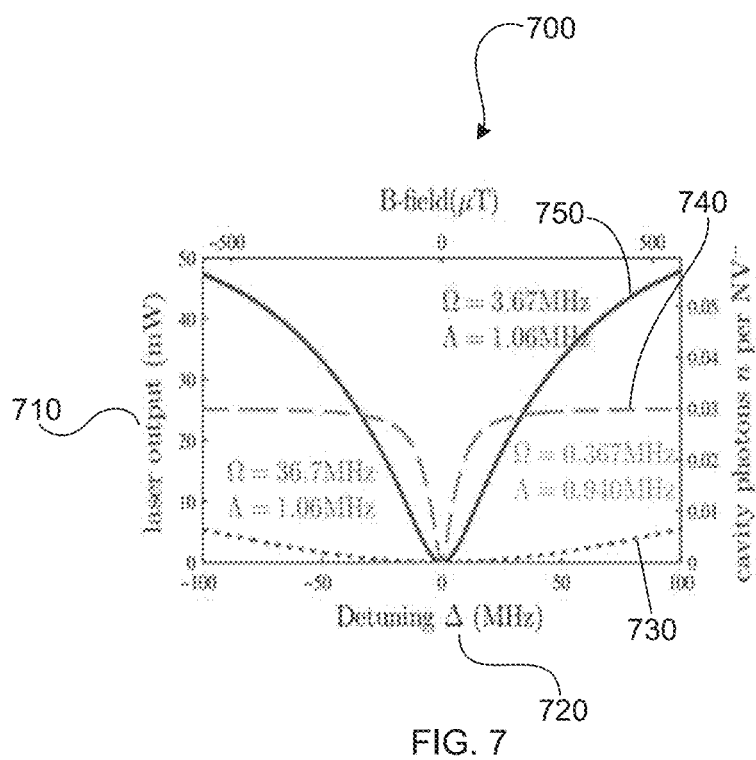
FIG. 7 is another plot showing the laser output as a function of detuning, for several examples of laser magnetometer based on NV centres with different parameters.
Figure 10:
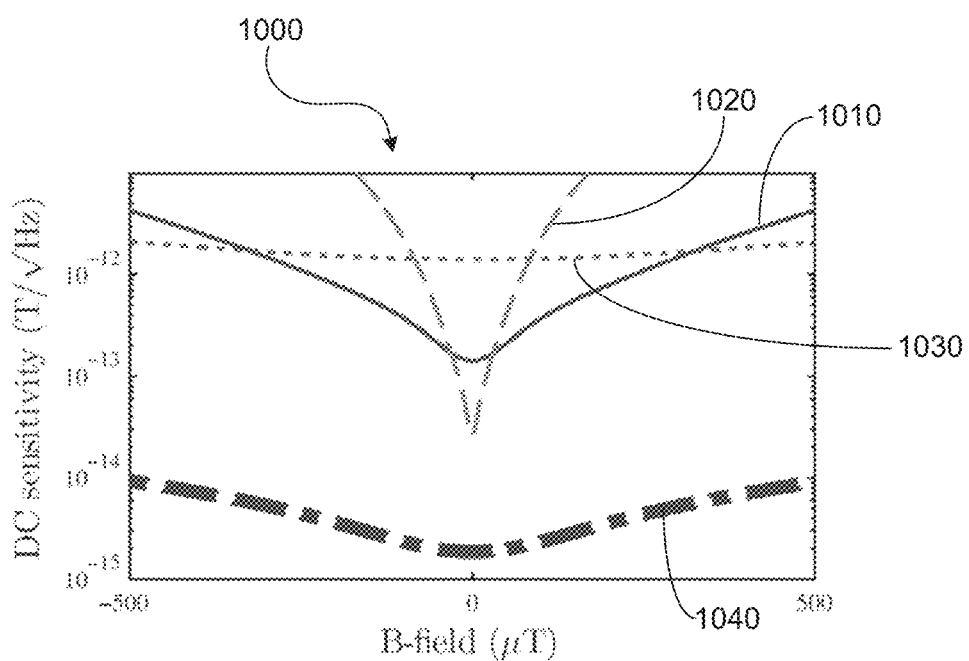
FIG. 10 is a plot showing the sensitivity for measuring magnetic fields as a function of the magnetic field strength for several examples of laser magnetometer based on NV centres with different parameters.
Figure 8A:
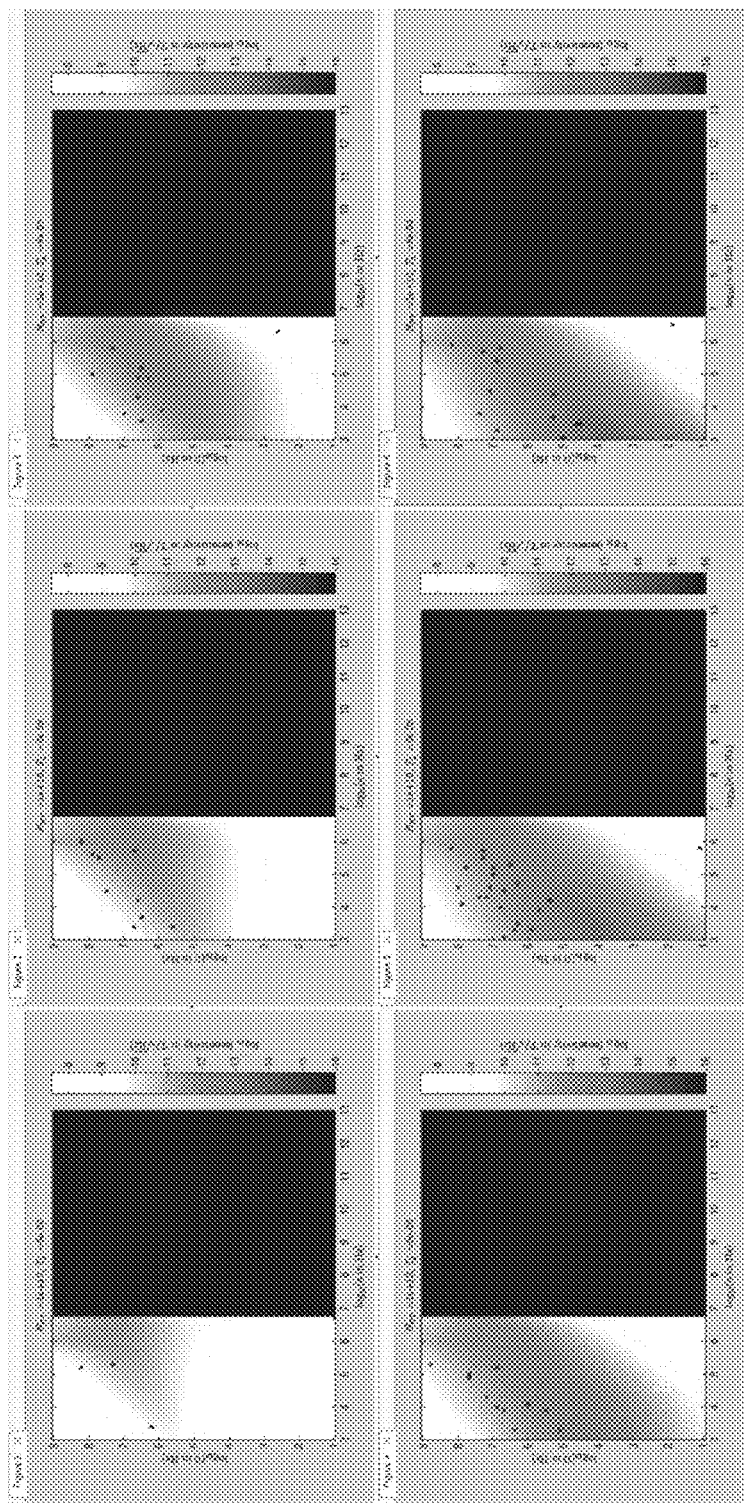
In FIGS. 8A to 8D there are a number of plots showing sensitivity as a function of the cavity loss rate $\kappa$ and the RF drive strength $\Omega$ for several different combinations of the number of NV centres inside the cavity and coherence time $T2^*$ (which is the inverse of the dephasing rate $T2^*=1/\Gamma_{14}$).
Figure 8B:
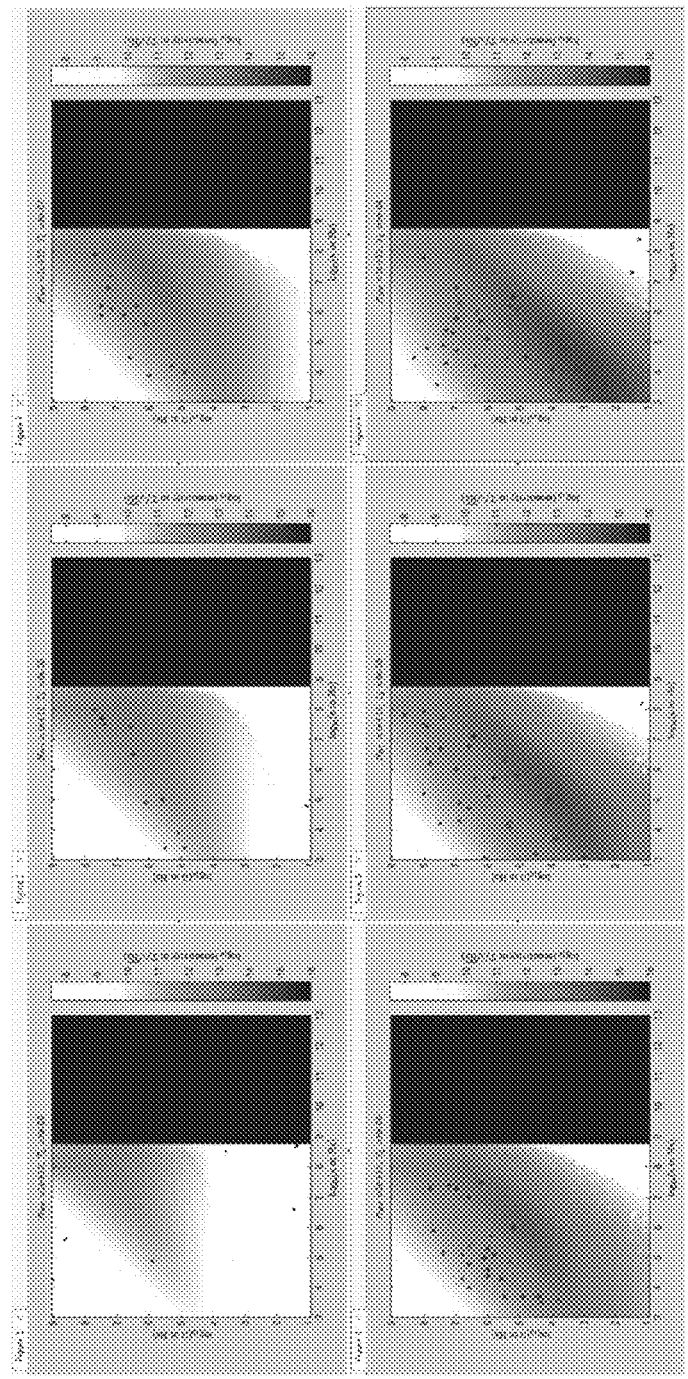
Figure 8C:
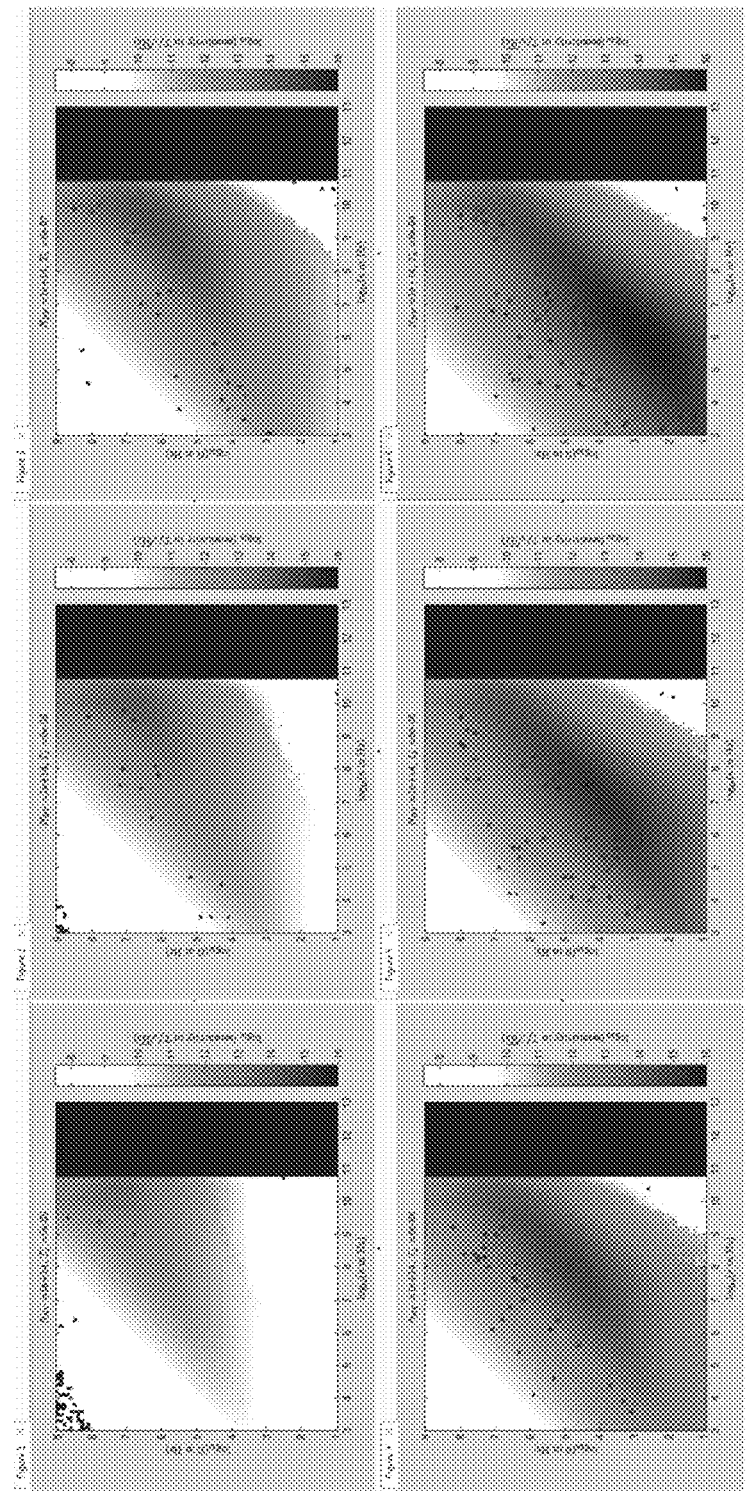
Figure 8D:
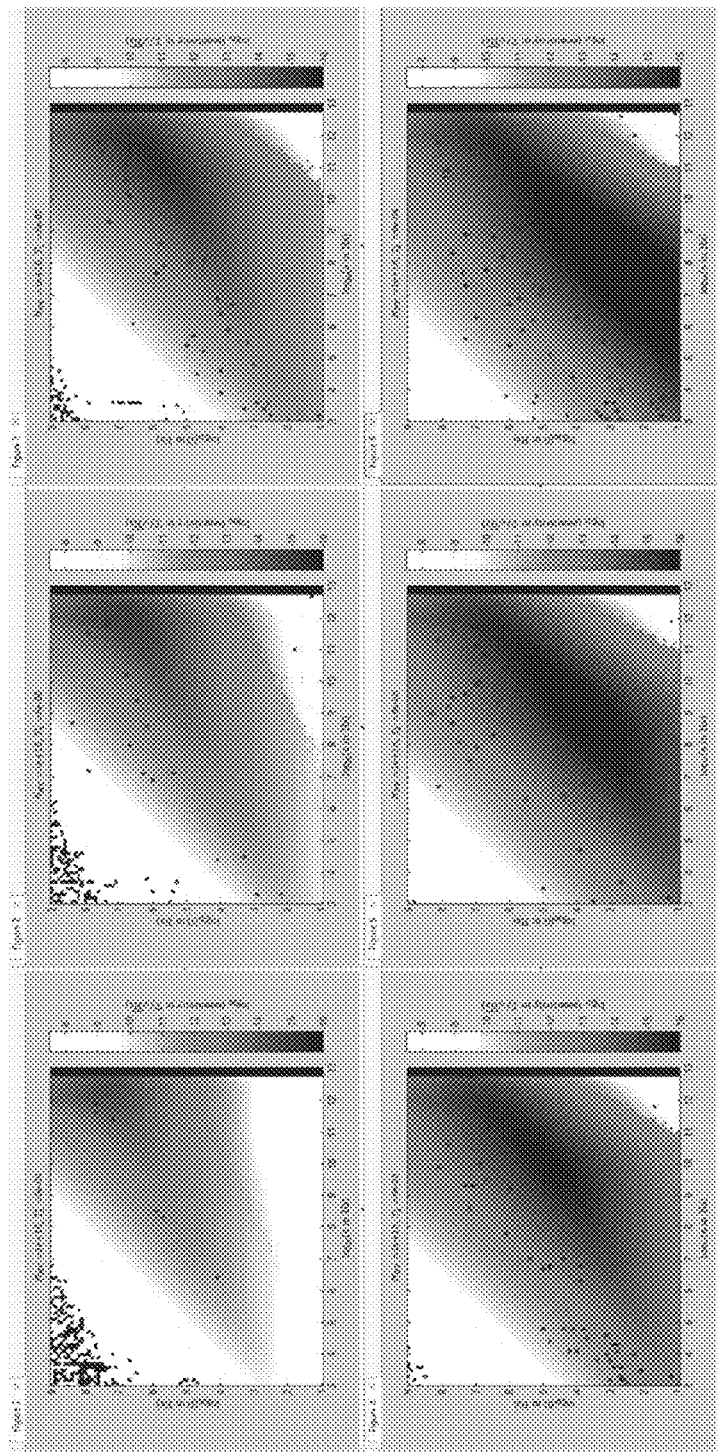
Figure 9A:
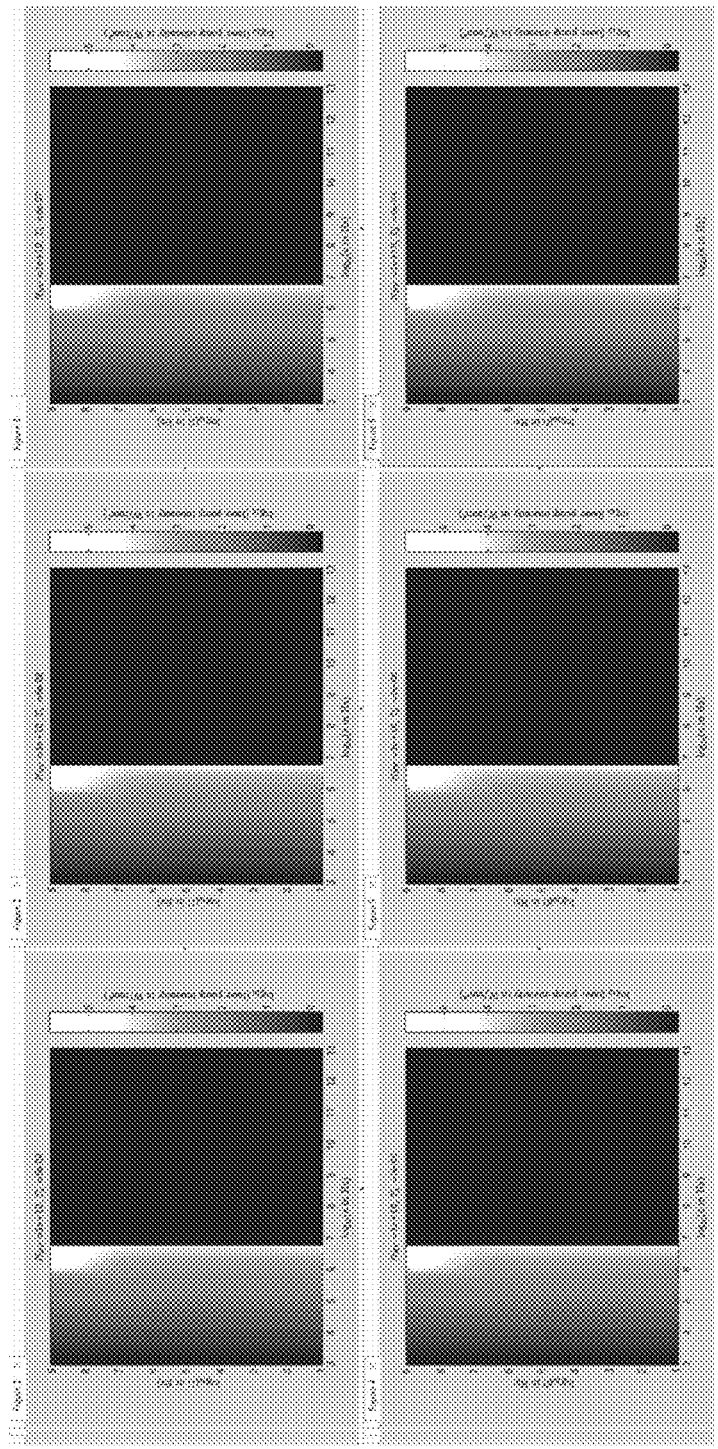
In FIGS. 9A to 9D there are shown corresponding plots of the pump laser irradiance in Watt/mm$^2$.
Figure 9B:
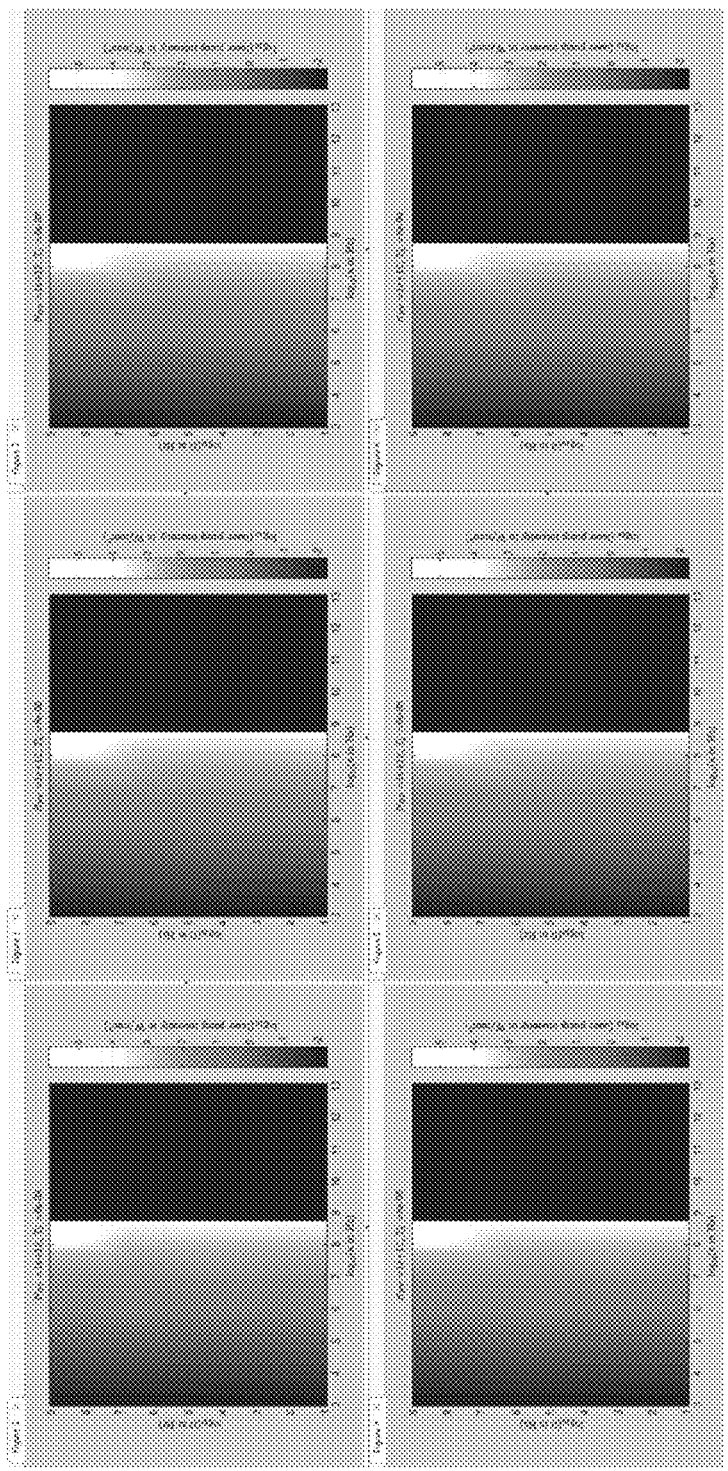
Figure 9C:
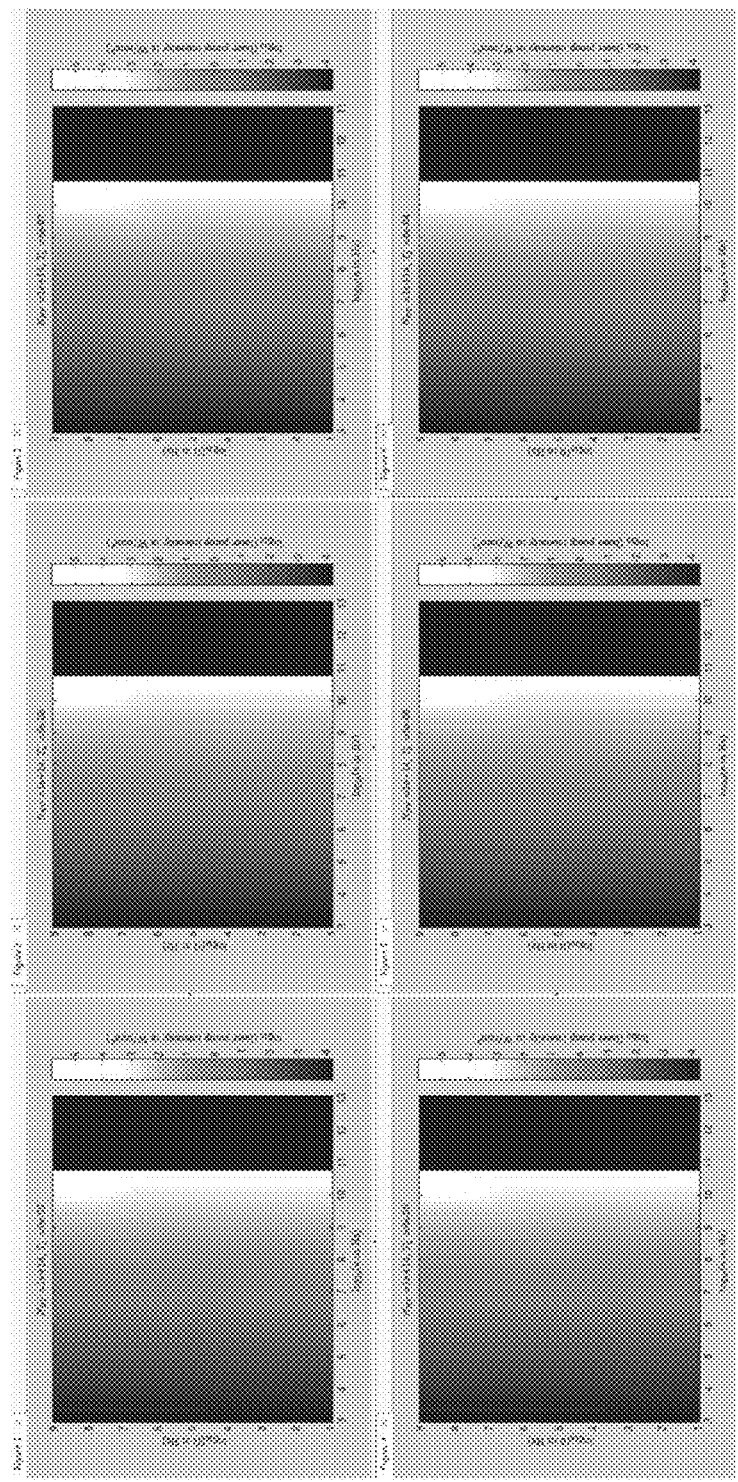
Figure 9D:
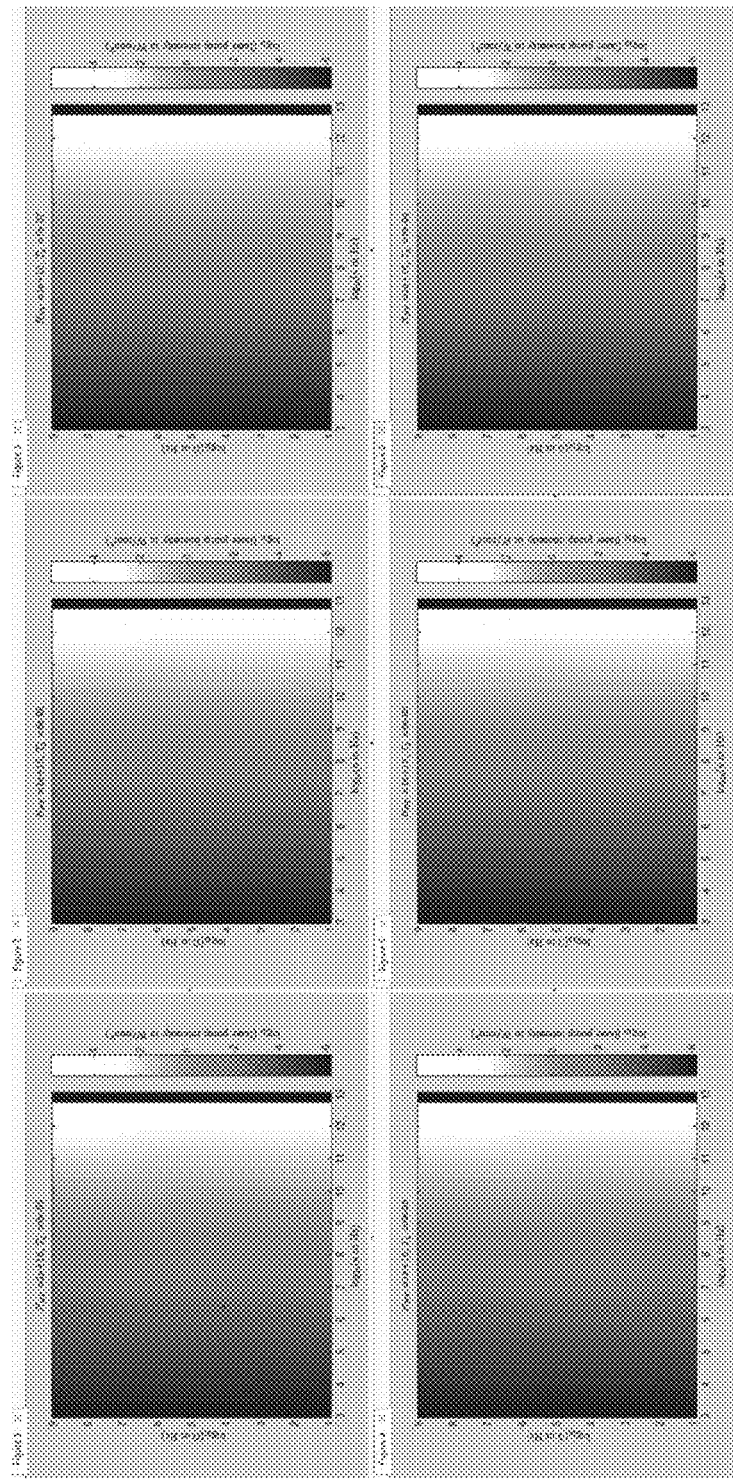

For the numerical examples in FIGS. 5, 6 and 7, as well as the curves 1010, 1020 and 1030 in FIG. 10 the following parameters were used:

$\nu_{23}=c/708$ nm (1.75 eV photon energy), the corresponding wavelength $\lambda=708$ nm/2.4, where 2.4 is the refractive index of diamond, the peak width of the three-phonon sideband $\Delta_{23}\approx24$ THz. Assuming a density of NV centres of 1 per $(100\text{ nm})^3$, which corresponds to 5.7 ppb, a laser medium volume of 1 mm³ and a cavity volume $V_c=2$ mm³ gives a cavity-induced transition rate of $G_{23}=G_{56}=G=308$ MHz. The spontaneous decay rate to the three-phonon sideband is $L_{23}=L_{56}=18$ MHz and the direct decay rate $L_{21}=L_{54}=68.2$ MHz. The phononic decay is much faster and set to $L_{31}=L_{64}=1$ THz, since the exact value is unknown, but unimportant as it is fast compared to the other decay rates, and small compared with the transition frequencies. Since spin-echo of any kind is not performed, the dephasing is set by the inhomogeneous coherence time $T^*_2$. For the assumed low density of 5.7 ppb NV this time is determined by the $^{13}$C concentration, which can be reduced from the natural abundance of ~1% by isotopic purification. The dephasing rate was set to $\Gamma_{14}=(1\text{ µs})^{-1}$ which is above already experimentally achieved values. The cavity loss rate is set to $\kappa=3$ MHz, which corresponds to a cavity $Q=2\pi\nu_{23}/\kappa=8.9\times10^8$, neglecting all other losses.

Referring now to FIG. 5, there is shown a plot representative of an example of a laser threshold magnetometer based on NV centres with the parameters described above. The plot 500 shows the laser output power 510 as a function of laser pump rate 520 with on-resonant RF drive 530 and off-resonant RF drive 540. The laser threshold is the point where the laser output starts to be non-zero 550 and is visibly shifted between the on-resonant RF drive curve 530 and off-resonant RF drive curve 540. The laser threshold of the on-resonant RF drive curve 530 is a good choice for an operating point, i.e. the RF drive can be set fixed to this strength. That operating point means that any external magnetic field causes non-zero detuning and therefore turns the laser on with a particular laser output. The RF drive strength is chosen as 3.67 MHz in the plot shown in FIG. 5.

Referring now to FIG. 6, there is shown another plot 600 representative of the laser threshold magnetometer shown in FIG. 5, showing the laser output 610 as a function of the laser pump rate 620 and detuning 630. For a fixed RF drive frequency the detuning is solely set by the external magnetic field. The on-resonant RF drive 530 and off-resonant RF drive 540 curves of FIG. 5 are contained in this plot and indicated by horizontal lines 640 and 650 respectively. For a fixed RF drive set to the operating point indicated in FIG. 5, the magnetic field changes the laser output along the vertical line 660.

Referring now to FIG. 7, is shown another plot 700 representative of the laser threshold magnetometer shown in FIGS. 5 and 6, showing the laser output 710 as a function of detuning 720 (set by the magnetic field). By adapting the RF drive strength (and the laser pump rate to the new operating point) it is possible to choose between a wide measurement range (line 730) or a strong response to changes in the magnetic field (dashed line 740). The solid line 750 is contained in FIG. 6 as vertical line 660. The other two lines have different laser pump rates and RF drive strengths as given.

For the given parameters, FIG. 5 shows how the lasing threshold is shifted with detuning (i.e. the difference)

between the frequency of the RF drive and the corresponding transition frequency set by the external magnetic field. An efficient way to operate the laser threshold magnetometer is to set the RF drive to a fixed frequency which corresponds to the zero-field splitting, i.e. set the RF drive to the frequency, which is on-resonance with the transition in the absence of any external magnetic field. Any detuning is then purely determined by the external magnetic field to be measured. Furthermore an efficient way of operation is to also set the laser pump rate to a fixed value, referred to as the operating point. A good choice for this operating point is the highest laser threshold, which occurs for zero detuning (see FIG. 5). Zero detuning corresponds to zero external field when the RF drive frequency is set to the zero-field splitting. This choice of RF drive frequency means that any external magnetic field causes detuning, which means that the laser threshold is shifted below the operating point and the laser turns on with a laser output unique to that magnetic field strength. The laser output then provides a direct measurement of the external magnetic field.

Using the above described choice of an operating point, the external magnetic field uniquely determines the laser output, i.e. a certain laser output will provide a direct measurement of the magnetic field. For the example parameters described above, the connection between magnetic field and laser output can be seen in FIG. 7. For any set of parameters of an NV laser threshold magnetometer, this same connection is given by the equation for the laser output as a function of the detuning given in FIG. 4. FIG. 7 shows that the laser output varies from its maximum value all the way to zero, i.e. provides a strong response to the magnetic field and excellent contrast. This is a distinct advantage of laser threshold magnetometry over other measurement techniques, such as ODMR or any other magnetometry schemes with NV centres.

In the mode of operation described, the measurement is simply obtained by measuring the laser output for a certain measurement time. The laser output changes with the magnetic field over the measurement range in a known fashion (see details for NV in FIG. 4 or the example in FIG. 7), such that a particular measurement value of the laser output converts to a particular value of the magnetic field. To measure a constant magnetic field the constant laser output is measured. Measurement of oscillating magnetic fields is described further below.

The precision of measurement is determined as the smallest magnetic field value to which the measurement is correct. Ultra-high precision means that the magnetic field value to which the measurement is correct is ultra-low, i.e. the values of the sensitivity are ideal when they are extremely low. For a single measurement of the magnetic field the precision will be given by a magnetic field strength (in Tesla) to which the measurement is precise. This precision value is smaller (i.e. better) the longer the measurement lasts for and decreases with a factor of $1/\sqrt{(T)}$, where T is the measurement time. To obtain a quantity independent of the measurement time the sensitivity is simply defined by the product of the measurement precision multiplied with $\sqrt{(T)}$ as:

$$\eta = B_{min}\sqrt{T} \qquad \text{(Equation 10)}$$

The sensitivity quantifies how precise the laser threshold magnetometer (or any magnetic field sensor) is and is measured in Tesla*√(second), or equivalently Tesla/√(Hertz). For measurements of a constant magnetic field B the sensitivity can be calculated as:

$$\eta_{dc} = \frac{dB}{dn}\sqrt{\frac{n}{N_{at}\kappa}} \qquad \text{(Equation 11)}$$

In Equation 11 the derivative can be calculated as:

$$\frac{dB}{dn} = \left(\frac{d\Delta}{dB}\frac{dn}{d\Delta}\right)^{-1} \qquad \text{(Equation 12)}$$

where the first term defines how the external magnetic field changes the RF addressed transition frequency (and for fixed RF drive frequency therefore the detuning) and the second term can be calculated from the solution for n as a function of the detuning. The first term is the magnetic dipole moment of the RF addressed transition and (for a transition where $m_S$ changes by one) is given by:

$$\frac{d\Delta}{dB} = \frac{g_e\mu_B}{\hbar} \qquad \text{(Equation 13)}$$

For measurements of an oscillating magnetic field $B(t) = B_S \cos(\omega t)$ the number of cavity photons per atom or colour centre also oscillates $n(t) = n_S \cos(\omega t) + n_0$. The sensitivity can be calculated as:

$$\eta_{ac} = \frac{dB_S}{dn_S}\sqrt{\frac{n_0 I}{N_{at}\kappa}} \qquad \text{(Equation 14)}$$

where the factor I=2.43 stems from the signal's contribution each oscillation period.

For a small oscillation amplitude and an effective DC bias achieved by a given detuning of the RF drive, the offset $n_o$ is given by the DC response (FIG. 4) to the RF drive detuning in the absence of oscillations and the derivative $$\frac{dB_S}{dn_S}$$

can be calculated using the derivative of the DC response at the point $n = n_o$, i.e. using Equation 12. This calculation of $$\frac{dB_S}{dn_S}$$

presumes that the magnetic field oscillation is not faster than the response time of the laser threshold magnetometer. The AC sensitivity can also be determined via a numerical simulation of the response based on the differential equations for the laser threshold magnetometer wherein the amplitude $n_S$ and the offset $n_o$ are determined numerically and $$\frac{dB_S}{dn_S}$$

can be determined numerically from $$\frac{dn_S}{d\Delta}$$

by simulating several detunings. This was done for FIG. 12 and confirmed Equation 14 for the region where the frequency is below the response time.

In FIGS. 8A to 8D a number of plots are provided containing information as to how lasing can be achieved as well as information as to how good sensitivity can be achieved. In the plots the DC sensitivity is shown as a function of the cavity loss rate κ and the RF drive strength Ω for several different combinations of the number of NV centres inside the cavity and the coherence time T2* (which is the inverse of the dephasing rate T2*=1/Γ$_{14}$). The plots provide information about which sensitivity is achieved for any set of parameters.

FIGS. 8A to 8D show the sensitivity plots followed by FIGS. 9A to 9D which show the pump laser irradiance plots for the same parameters. The dots within the plots are the result of failures of the numerical algorithm and can be ignored. FIGS. 8A to 8D are based on Equation 11 and FIG. 4 and assume the internal decay rates of the NV centre as given above and always set the laser pump rate to its respective operating point, which is determined as the laser threshold (i.e. the root of n as a function of the laser pump rate) for zero detuning. The volume of the laser medium and cavity are assumed as given above but changes to either values have clear effects and can be optimised as given further below.

Referring now to FIG. 10 there is shown a plot 1000 of several examples of a laser threshold magnetometer based on NV centres with different parameters. Curves 1010, 1020 and 1030 correspond to curves 750, 740 and 730 respectively for the same parameters as in FIG. 7. Curve 1040 is for parameters chosen to achieve ultra-high precision, i.e. extremely low sensitivity values. The parameters chosen are an NV density of 16 ppm, coherence time of 0.181 microseconds, cavity loss rate of 63.1 GHz, laser pump rate of 10.4 MHz and RF drive strength of 6.14 MHz. The cavity loss rate is a parameter set in the construction of the laser threshold sensor, specifically the cavity. The RF drive strength (i.e. Rabi frequency) is a calibration parameter, which can easily be adjusted after construction for different measurements with the same laser threshold sensor. It can make sense to adjust both the RF drive strength as well as the laser pump to achieve either good sensitivity or wide measurement range. Plots such as FIG. 7 and FIG. 10 can be produced for any set of parameters and show how the calibration parameters can be chosen to optimize either for sensitivity or measurement range. In FIG. 7 the laser pump strength is set to the respective operating point, which can be seen by the fact that the laser output power is zero if and only if the detuning is zero.

To achieve lasing and reach ultra-high precision the right parameters need to be chosen. This includes the laser medium volume, density of optically active atoms or colour centres, coherence time, cavity volume, cavity loss rate, RF drive intensity and laser pump strength. How each of these parameters should be chosen, which combination of parameters achieves lasing and how to achieve best sensitivity for given constraints is described below.

Plots of the sensitivity which is achieved for a range of all free variables is shown in FIGS. 8A to 8D. The plots show that for each combination of coherence time and number of atoms or colour centres, i.e. NV centres in the illustrated example, there is an ideal combination of cavity loss rate and RF drive strength which achieves the best (i.e. lowest value of the) sensitivity. This ideal combination is given by the centre of the spot where the colour goes smoothly towards the dark end of very low sensitivities and marks the values for the cavity loss rate and RF drive strength which achieve the lowest sensitivity value for each particular choice of coherence time and number of optically active atoms or colour centres. The different lowest sensitivity values at this point in different plots can be used to determine the optimal combination of number of optically active atoms or colour centres and coherence time. For any given volume of the laser medium the number of atoms or colour centres corresponds to a density. The volume of the laser medium is typically maximised, see below.

The plots in FIGS. 8A to 8D also provide information for which parameters NV laser threshold magnetometry is possible at all. When the cavity loss rate gets too large or the number of NV centres too small then lasing cannot be achieved. This can be seen by the black regions to the right hand side of the plots, where the cavity loss rate is too large for lasing. For the parameters in these regions lasing is not achieved, i.e. these parameters are not suitable to build a laser threshold magnetometer. It can be seen that for smaller numbers of NV centres the edge of this region moves further left, i.e. towards smaller cavity loss rates. This is because for lower numbers of NV centres lasing is harder to achieve and a lower cavity loss rate is necessary.

For a fixed cavity volume and coherence time a higher number of atoms or colour centres achieves better sensitivity. The number of optically active atoms or color centres is set by the choice of corresponding density in and volume of the laser medium. It is therefore best to maximise the volume of the laser medium inside the cavity. It is furthermore advantageous to use a high density of atoms or colour centres, however there is a trade-off in the fabrication of the laser medium containing the atoms or colour centres, since with increased density the coherence time is often shortened. It is ideal to maximise both. For NV centres in diamond this can be seen in the plots by the fact that the optimal sensitivity increases both with NV density and coherence time. Isotopic purification of the diamond can help to increase the coherence time without reduction of the NV density. Maximising the conversion efficiency from N impurities to NV centres by ideal radiation and annealing conditions increases the NV density with lowest impact on the coherence time. These measures can be taken to maximise NV density and coherence time at the same time. For any choice of laser medium with a given volume, density and coherence time a plot such as the examples in FIG. 8 can be produced in the same way. The optimal cavity loss rate and RF drive intensity can then be determined from the plot.

Furthermore it is always advantageous to increase both the cavity volume and the volume of the laser medium by the same factor. However, one is limited by the largest volume available and price of the laser medium, particularly in case of a single crystal laser medium, and by the ability to pump a large volume and create a coherent light field over a large volume. For NV centres in a single-crystal diamond a volume of 1 mm³ can be realistically obtained. This value can be used to calculate the plots and set the cavity volume to 2 mm³. An increase of the laser medium volume and the cavity volume, both by a factor f>1 results in an increase of the laser output by the same factor and hence an improvement of the sensitivity by a factor of √f. A change of only the laser medium volume with a fixed density of atoms or colour centres is equivalent to an increase of the number of atoms or colour centres. A change of the cavity volume only by a factor f is equivalent to a reduction of atoms or colour centres by the same factor for the calculation of G (and therefore the calculation of n in FIG. 4). Above there is described how the ideal parameters can be determined to optimize the sensitivity and/or measurement range. Below there is also described how the requirement of homogeneous application of the pump power can create restrictions and how these restrictions need to be considered. Furthermore any of the parameters can likely be restricted to a certain range of possible values due to technical availability and/or cost. For example a certain type of laser medium might only be available with a certain range of colour centre densities or a certain range of volumes. Another likely example is that the laser pump power is restricted to a certain maximum power due to technical availability and/or heating and/or safety of the device. All such restrictions can easily be taken into account by optimizing the parameters only within the restricted possible range.

The frequency and wavelength of the laser pump are chosen such that it actually pumps the laser medium. For NV centres this is a wavelength with good absorption, for example laser light at 532 nm. The laser pump strength is ideally chosen to be at or close to the operating point, defined by the laser threshold. More specifically, for laser media where the laser pump together with the internal decay structure drives towards the brighter state (such as the NV centre in diamond), the operating point is the laser threshold at zero detuning (see FIG. 5). This operating point determines the laser pump strength, i.e. the laser pump strength cannot be chosen arbitrarily for the laser threshold sensor to work (and particularly to work ideally). For the sensitivity plots in FIGS. 8A to 8D the laser pump strength is always set to the respective operating point.

The maximal laser pump strength that is technically achievable needs to be considered in the following way since it can limit the process of finding the parameters for optimal sensitivity. The laser pump should ideally be applied uniformly to the whole laser medium, although this can be compromised without destroying the operation of a laser threshold sensor. The pump is applied uniformly when the power provided by the pump is much more than the power absorbed by the atoms or colour centres $P_{pump} \gg P_{abs}$. If the laser pump is another laser the pump power in Watt is given by:

$$P_{pump} = A_{pump} \hbar \omega_{pump} \Lambda / \sigma \qquad \text{(Equation 15)}$$

where A is the area illuminated by the pump, $\hbar$ is Planck's constant, $\omega$ the angular frequency of the pump light, $\Lambda$ the laser pump strength in Hertz and $\sigma$ the effective cross-section of the atom or colour centre.

The power absorbed is given by:

$$P_{abs} = \hbar \omega_{pump} \Lambda N_{at} \qquad \text{(Equation 16)}$$

where $N_{at}$ is the number of atoms or colour centres.

The pump power $P_{pump}$ refers to the power necessary if all atoms or colour centres are exposed to the same pump power. The absorbed power $P_{abs}$ refers to the power which is actually absorbed by the laser medium in that same case. For all colour centres to be exposed to approximately the same pump power the absorbed power should be much less than the pump power at the operating point for $\Lambda$. Otherwise the power of the pump is reduced by absorption as it passes through the laser medium and the pump power is not uniform throughout the laser medium any more. Parameter choices which make $P_{abs}$ similar to or even larger than $P_{pump}$ are not ideal for optical laser pumping because then the laser medium becomes significantly absorbing for the pumping light and excites the atoms or colour centres much stronger at the side of the laser medium, where the laser pump enters the laser medium, compared to the other side. However, when lasing is achieved in such a regime the output laser field in the cavity is still uniform (speaking in terms of the envelope of the nodes and antinodes) throughout the laser medium and will create stimulated emission even for weakly pumped atoms or colour centres. Therefore such a regime, although not ideal, might be chosen for certain reasons, such as a lower laser threshold or a wider range of magnetic fields or better sensitivity. To keep $P_{abs}$ below a certain fraction p of $P_{pump}$ the density and geometry of the laser medium needs to fulfil:

$$\frac{P_{abs}}{P_{pump}} = \frac{N_{at} \sigma}{A_{pump}} < p \qquad \text{(Equation 17)}$$

which can be achieved by using an appropriate density and/or volume or by adjusting the area, which is being pumped by using a suitable geometry of the laser medium within the limits of the cavity design.

Figure 11:
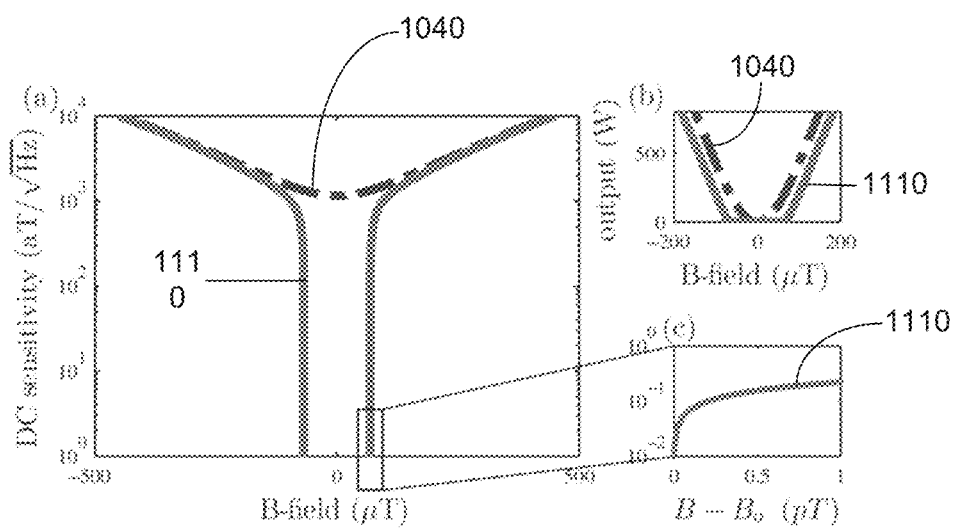
FIG. 11 is a plot showing the alternative measurement modality to achieve very good sensitivity: (a) Sensitivity as a function of magnetic field strength, (b) laser output as a function of magnetic field strength, and (c) enlargement of the highly sensitive magnetic field range.

An alternative measurement modality is to lower the laser pump to a fixed value below the upper laser threshold. The upper laser threshold refers to the laser threshold when the RF drive is on resonance (for laser media where the laser pump together with the internal decay structure drives towards the brighter state). This measurement modality achieves a better sensitivity, i.e. precision, at the expense of the measurement range of magnetic fields. FIG. 11 shows the effects of this measurement modality with the example parameters used for curve 1040 in FIG. 10. Curve 1040 is plotted again and an additional curve 1110 shows the effect when the laser pump is reduced. In this example it is reduced to 96% of the value of the curve 1040, which achieves much better (i.e. lower values of) sensitivity for a small range of magnetic fields, (a). Pumping below the upper threshold always means that a certain minimum magnetic field strength $B_0$ is required for the system to start lasing, i.e. giving any output. This can be seen in (b), where curve 1110 shows zero output over a range of magnetic field values. At the minimum magnetic field strength $B_0$ the output changes from zero to finite values. While the output at $B_0$ is still zero, the first derivative (i.e. the gradient) of the output with the magnetic field strength has a discontinuity with finite values above and zero below $B_0$. This leads to a sensitivity, which goes to zero. In a short range of magnetic fields just above $B_0$ the sensitivity is much better than on curve 1040. This means that for short ranges of magnetic fields the sensitivity is boosted to very good values. One can get into this range by effectively offsetting the magnetic field to $B_0$, for example by an adjustment of the detuning of the RF drive and the transition frequency. To give an example of how much the sensitivity can be improved it is shown that for the example parameters and a measurement range of 1 Picotesla sensitivities below $0.219$ aT/$\sqrt{(Hz)} = 2.19 \times 10^{-19}$ T/$\sqrt{(Hz)}$ are achieved this way, see (c). This is an improvement in sensitivity of four orders of magnitude relative to the measurement modality where the laser pump is at the upper threshold (blue curve). This sensitivity boost works for both constant (DC) and oscillating (AC) magnetic field measurements.

A laser threshold magnetometer can also measure oscillating (AC) magnetic fields. If the magnetometer is placed in an oscillating magnetic field, the laser output oscillates between values corresponding to the maximum and minimum of the oscillating magnetic field. Such oscillations can be measured well as long as the oscillation time is not shorter than the response time of the magnetometer. To be able to measure a large spectrum of frequencies the response time of the sensor should be minimised. The response time is essentially set by the inverse of the lowest of the following frequencies or rates: the laser pump rate, the effective internal non-spin-conserving decay rate of the laser medium, the RF drive strength (i.e. the Rabi frequency) or the cavity decay rate. The response time is minimised by choosing all of these frequencies and rates large. The effective internal non-spin-conserving decay rate is the only one which is set by the laser medium and cannot be adjusted and therefore defines the shortest possible response time. For the NV centre this rate is the decay via the singlet state (from state 5 via state 7 to state 1 in FIG. 1) and sets the response time to approximately:

$$1/L_{57}+1/L_{71}=0.5 \text{ μs} \quad \text{(Equation 18)}$$

For frequencies with an oscillation period longer than that, the laser output oscillates corresponding to the magnetic field.

For a good measurement of even small magnetic field oscillation amplitudes an effective bias field can be set to offset the laser output to its point of maximal gradient with the magnetic field. This ensures that the laser output changes the strongest with the magnetic field oscillation. An effective bias field can be set easily by detuning the RF drive from the corresponding transition frequency. Very small amplitude oscillations can be measured with exceptional sensitivity by adjusting the laser threshold magnetometer to the small range of boosted sensitivity outlined above and in the example of curve 1110 in FIG. 11.

Figure 12:
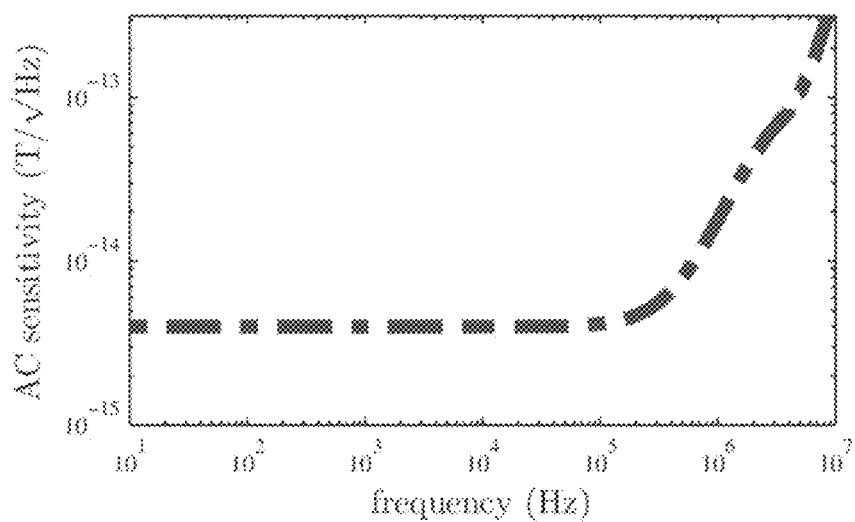
FIG. 12 is another plot showing the sensitivity for measurements of an oscillating field as a function of frequency.

Referring now to FIG. 12, the sensitivity for an AC measurement can be calculated in accordance with Equation 14, and reaches very similar values as the DC sensitivity. FIG. 12 shows the sensitivity for measurements of an oscillating field as a function of frequency for the parameters of curve 1040 in FIG. 10 with an effective bias DC field of 164 μT to reach the region where the laser output has the strongest gradient with the external B-field. For high frequencies the sensitivity gets worse due to the response time of the magnetometer. This figure was simulated with a magnetic field amplitude of 1 nT.

A vector magnetometer measures the component in one direction of the magnetic field vector. The laser threshold magnetometer can be realised as a vector magnetometer by using only one orientation of NV centres for the sensing. In a single crystal diamond there are four possible orientations for the NV centres. Using only one orientation for the sensing can be achieved by one or several of the following measures:

Fabrication of NV centres in diamond with preferential orientation

Usage of a polarisation filter inside the cavity, which selectively absorbs photons emitted from a certain orientation more likely than another Polarisation-selective pumping of a certain orientation Directional alignment of the laser pump to pump a certain orientation preferentially over another Directional alignment of the RF drive to address a certain orientation preferentially over another By combining three laser threshold magnetometers which measure three orthogonal components, the entire magnetic field vector can be measured. The magnitude of the magnetic field vector can be calculated from that.

A single laser threshold magnetometer can also be realised as a magnetometer which measures magnetic field strength regardless of the orientation by directionally aligning the laser pump and the RF drive such that they address all four orientations equally. Such a laser threshold magnetometer senses magnetic fields in all directions.

Non-sensing centres do not create significant background fluorescence but instead can amplify the signal of the sensing centres because they also contribute to the signal via stimulated emission due to their interaction with the light field once the sensing centres have shifted the laser threshold and caused lasing.

The output from a laser threshold sensor is laser light which can be easily fibre-coupled, i.e. directed into and guided through an optical fibre, for example by either simply placing the end of an optic fibre outside the cavity or even by using fibre-cavities, where one end of the cavity is given by the end of an optic fibre with a suitable surface. Fibre-coupling is advantageous as it enables the guiding of the output (for example towards the light detector) and therefore makes it possible to move the sensor around and allows for remote sensing. This makes the laser threshold sensor very versatile. The ability for a fibre-coupled output is an advantage over existing magnetometry schemes, for example, which rely on the collection of spontaneously emitted light, which typically requires the usage of a large fixed optical system.

The laser threshold sensor can be designed such that parts of or the whole optical cavity is provided by the optic fibre itself. The surface of the end of the optic fibre itself can be regarded as a partially transmitting mirror and therefore form one end of the optical cavity. Alternatively the reflection at the end of the optic fibre can be minimised and reflection can be arranged by a structure within the optic fibre, such as a fibre Bragg grating. A further alternative is that the laser medium for the laser threshold sensor could be integrated into the optic fibre and surrounded by reflecting structures, such that the fibre itself provides the whole optical cavity. For example a fibre Bragg grating on both sides could provide the optical cavity.

If the laser pump is given by light then this laser pump light can be conveniently provided into the cavity through the optic fibre. In that case the cavity should be resonant with the pump laser light (as well as the emission from the laser medium) to enable the laser pump light to enter the cavity and to be amplified for cases where the laser medium is not strongly absorbing. If the cavity is made of mirrors with a wavelength dependence such as a fibre Bragg grating then two cavities (one inside the other) which are tuned to the pump wavelength and the emission wavelength respectively are a possible design.

For precise measurements the technical noise should be minimised. The laser pump signal can fluctuate around its intended value. This can introduce technical noise because stronger or less strong driving can increase or decrease the laser output. Such fluctuations can be reduced for example by using amplitude stabilisers on the laser pump signal. If significant fluctuations remain on the laser pump signal the effect of such fluctuations can be counteracted or overcome by monitoring the pump laser signal and analysing the laser output signal of the magnetometer in relation to the pump laser signal, such that changes of the laser output signal due to changes in the magnetic field, for example, can be distinguished from changes of the laser output due to fluctuations in the laser pump signal. If the laser pump is another laser the signal can for example be monitored by splitting off a small fraction of the laser beam and directing it to a light detector, while the rest of the beam forms the laser pump signal for the laser threshold sensor.

Similarly fluctuations of the RF drive in both amplitude and frequency can be minimised and can furthermore be counteracted by monitoring the RF drive signal and analysing the laser output signal in relation to the RF drive signal.

While NV centres in diamond have been used as the main example, another example of a solid-state material, which is a suitable laser medium, is Cerium in Yttrium-Aluminium-Garnet (YAG), particularly $Ce^{3+}$ ions in YAG.

Figure 13:
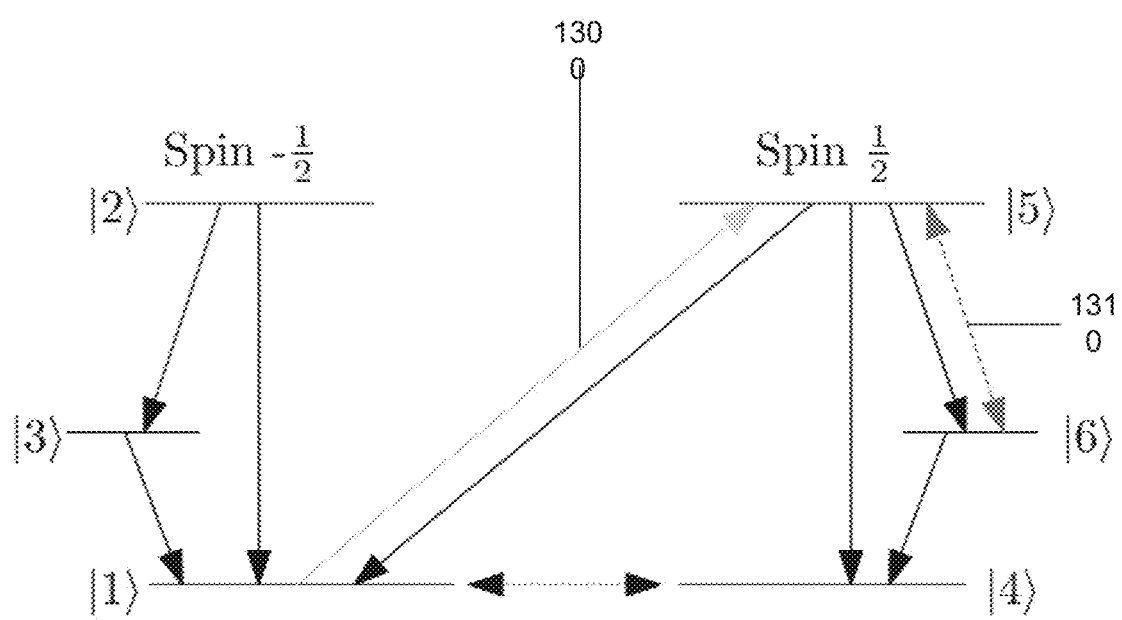
FIG. 13 is a schematic representation of the states of a Cerium in YAG centre as an example of a suitable laser medium according to an embodiment of the present invention.

Referring now to FIG. 13, there is shown the level structure of $Ce^{3+}$ in YAG. The ground states 1 and 4 are the 4f(1) electron configuration, the excited states 2 and 5 are 5d(1) electron configuration. States 1, 2 and 3 are the spin manifold with $m_S=-\frac{1}{2}$, states 4, 5 and 6 are the manifold with $m_S=\frac{1}{2}$. States 3 and 6 are phonon-added ground states corresponding to 1 and 4 respectively. The energy difference between the ground and excited state corresponds to a zero-phonon-line of about 489 nm. Internal decay rates are shown as solid downwards arrows. A laser pump within the absorption spectrum, for example 460 nm, effectively excites from state 1 to state 5 (1300). The excitation by the same laser pump from state 4 to state 2 is approximately 396 times weaker and can be neglected. From state 5 there are decay rates to states 1, 4 and 6. Continuous laser pump excitation drives the Cerium into state 4. An RF drive is applied between states 1 and 4 (1310). At the corresponding resonance frequency, which is approximately 650 MHz it induces transitions between states 1 and 4. The optical cavity surrounding the laser medium should be resonant (dashed double-sided vertical arrow (1320)) with the 5 to 6 transition and/or the 4 to 5 transition. The differential equations corresponding to FIG. 13 are very similar to Equation 1 and are given by:

$$\dot{\rho}_{11}=-2\Omega Im(\rho_{14})-\Lambda_{15}\rho_{11}+L_{21}\rho_{22}+L_{31}\rho_{33}+L_{51}\rho_{55},$$

$$\dot{\rho}_{14}=(i\Delta-\Gamma_{14}-\Lambda_{15}/2)\rho_{14}-i\Omega(\rho_{44}-\rho_{11}),$$

$$\dot{\rho}_{22}=-(L_{21}+L_{23})\rho_{22},$$

$$\dot{\rho}_{33}=L_{23}\rho_{22}-L_{31}\rho_{33},$$

$$\dot{\rho}_{44}=2\Omega Im(\rho_{14})+L_{54}\rho_{55}+L_{64}\rho_{66},$$

$$\dot{\rho}_{55}=\Lambda_{15}\rho_{44}-(L_{54}+L_{56}+L_{51})\rho_{55}-G_{56}(\rho_{55}-\rho_{66})n,$$

$$\dot{\rho}_{66}=L_{56}\rho_{55}-L_{64}\rho_{66}-G_{56}(\rho_{66}-\rho_{55})n,$$

$$\dot{n}=G_{56}(\rho_{55}+\rho_{66})n-\kappa n, \quad \text{(Equation 19)}$$

The solution is obtained in the same way as for Equations 1.

The differential equation for n is very similar to Equation 3 and given by:

$$\kappa=G(\rho_{55}(n)-\rho_{66}(n)) \quad \text{(Equation 21)}$$

The solution is obtained in the same way as for Equation 3.

Cerium in YAG is also a suitable laser medium for laser threshold magnetometry. Since the states 1 and 4 correspond to different spin states their energy difference depends on the external magnetic field and the first requirement is therefore fulfilled. From state 1 the laser pump efficiently excites the Cerium, leading to photon emission. From state 4 on the other hand the excitation by the laser pump is much weaker and therefore state 4 has less brightness under laser pumping than state 1. The second requirement is therefore fulfilled. Finally the third requirement is also fulfilled because the laser pump together with the internal decay structure drives the Cerium towards state 4.

The laser pump drives Cerium in YAG towards the less bright state, which is in contrast to NV centres, where the laser pump drives towards the brighter state. This means that when the RF drive is on resonance, in contrast to NV centres the laser threshold for Cerium in YAG is not at an upper bound but at a lower bound and increases as the RF drive is detuned. An operating point for the laser pump can therefore be chosen above this lower laser threshold. In that case an external magnetic field reduces the laser output.

The laser threshold sensor of the present invention demonstrates the potential to provide a number of advantages over the state of the art. A laser threshold magnetometer formed and operated in accordance with the principles set forth herein, for example, enables measurement of an external magnetic field with high sensitivity but does not need to be operated at cryogenic temperatures unlike prior art devices. Moreover, since the laser threshold magnetometer can be fibre-coupled, the laser output can be guided resulting in a capacity for the sensor to be moved around and allow for remote sensing. This makes the proposed laser threshold sensor very versatile.

While the invention has been described in conjunction with a limited number of embodiments, it will be appreciated by those skilled in the art that many alternatives, modifications and variations in light of the foregoing description are possible. Accordingly, the present invention is intended to embrace all such alternatives, modifications and variations as may fall within the spirit and scope of the invention as disclosed.

The invention claimed is:

1. A sensor for measuring an external magnetic field, the sensor including:
   (a) an optical cavity;
   (b) a laser medium which together with the optical cavity has a laser threshold;
   (c) a laser pump; and
   (d) a radio-frequency (RF) drive applied to the laser medium, such that the laser threshold varies with a change in the external magnetic field;
   wherein, the RF drive is applied to the laser medium at or around a resonance frequency which varies depending on the external magnetic field, such that depending on the value of the external magnetic field, the RF drive induces transitions between at least two states of the laser medium, each state causing a different laser threshold in an intensity of a laser output; and
   the intensity of the laser output is measured to provide a measurement of the value of the external magnetic field.

2. The sensor according to claim 1, wherein the laser pump is a light source, in or close to the visible range, or electrical pumping applied to the laser medium.

3. The sensor according to claim 1, wherein the laser output is directly fibre coupled.

4. The sensor according to claim 1, wherein a laser pump signal and its fluctuations are monitored and used in combination with the laser output to reduce technical noise.

5. The sensor according to claim 1, wherein the RF drive and any RF fluctuations are monitored and applied together with a laser output signal to reduce technical noise.

6. The sensor according to claim 1, wherein the laser medium is a solid-state material.

7. The sensor according to claim 6, wherein the laser medium is given by negatively charged nitrogen-vacancy (NV) centres in diamond.

8. The sensor according to claim 7, wherein NV centre laser pumping occurs from the electronic ground state triplet $^3A_2$ to the electronic excited state triplet $^3E$ and the states of the laser medium causing a different laser threshold in an intensity of a laser output, are at least two out of three states of the ground state triplet $^3A_2$.

9. The sensor according to claim 8, wherein at least one of the transitions between the $^3E$ states and the phonon-added states of the $^3A_2$ are used as a lasing transition.

10. The sensor according to claim 6, wherein the laser medium is formed by silicon-vacancy centres in diamond.

11. The sensor according to claim 6, wherein the laser medium is formed by cerium in yttrium-aluminium-garnet.

12. The sensor according to claim 1, wherein the sensor achieves a sensitivity better than nT/√(Hz).

13. The sensor according to claim 1, wherein the cavity includes a diffraction grating.

14. A method for measuring the strength of an external magnetic field, the method including the following steps:
(a) providing a sensor including a laser pump and a laser medium which together with an optical cavity forms a laser threshold;
(b) applying a radio-frequency (RF) drive to the laser medium, such that the laser threshold varies with a change in the external magnetic field; wherein, the RF drive is applied to the laser medium at or around a resonance frequency which varies depending on the external magnetic field, such that depending on the strength of the external magnetic field, the RF drive induces transitions between at least two states of the laser medium, each state causing a different laser threshold in an intensity of a laser output; and detecting the intensity of the laser output, wherein the intensity of the laser output provides a measurement of the strength of the external magnetic field.

15. The method according to claim 14, further including the step of determining the laser output and a sensitivity of the sensor as a function of a plurality of parameters from a steady-state solution to a plurality of differential equations relating to the sensor, wherein a laser pump strength is set to an operating point which is determined from the laser output as a function of the laser pump strength and the sensitivity of the sensor is optimised as a function of a remainder of the plurality of parameters within given constraints.

16. The method according to claim 15, further including the step of determining a sensor measurement range as a range of detuning between an RF addressed transition frequency and an RF drive frequency over which the output changes as a function of detuning.

17. The method according to claim 16, wherein a combination of a density of optically active atoms or colour centres and a coherence time of the RF addressed transition is selected based on an optimal sensor sensitivity and/or sensor measurement range.

18. The method according to claim 16, wherein an optical cavity loss rate is selected to achieve optimal sensor sensitivity and/or sensor measurement range.

19. The method according to claim 16, wherein an RF drive strength is selected based on an optimal sensor sensitivity and/or sensor measurement range.

20. The method according to claim 14, wherein a laser pump strength is set to the operating point, wherein the operating point is given by the highest laser threshold as a function of detuning.

* * * * *